United States Patent [19]
Tsuchida et al.

[11] Patent Number: 5,559,997
[45] Date of Patent: Sep. 24, 1996

[54] SYSTEM AND METHOD FOR DESIGNING A PRINTED-CIRCUIT BOARD

[75] Inventors: Masayuki Tsuchida, Osaka; Hirokazu Uemura, Yao; Shinji Miura, Kyoto; Yoshiyuki Saito, Hirakata; Hiroyuki Yoshimura, Ashiya; Yuichi Nishimura, Katano; Nobuo Sueda, Ikeda, all of Japan

[73] Assignee: Matsushita Electric Industrial Co., Ltd., Osaka, Japan

[21] Appl. No.: 317,859

[22] Filed: Oct. 4, 1994

[30] Foreign Application Priority Data

Oct. 4, 1993 [JP] Japan ................................ 5-247889

[51] Int. Cl.⁶ ........................................... G06F 17/50
[52] U.S. Cl. .......................... 395/500; 395/919; 395/920; 364/488; 364/491; 364/578
[58] Field of Search .......................... 395/500, 61, 900, 395/921, 23, 51, 800, 919; 364/488, 489, 490, 578, 491; 361/777, 818

[56] References Cited

U.S. PATENT DOCUMENTS

| | | | |
|---|---|---|---|
| 4,689,441 | 8/1987 | Dick et al. | 174/256 |
| 5,046,017 | 9/1991 | Yuyama et al. | 364/491 |
| 5,187,668 | 2/1993 | Okude et al. | 364/491 |
| 5,377,124 | 12/1994 | Mohsen | 364/489 |
| 5,418,728 | 5/1995 | Yada | 364/468 |
| 5,481,474 | 1/1996 | Lee | 364/491 |
| 5,488,540 | 1/1996 | Hatta | 361/794 |

OTHER PUBLICATIONS

"High–Density Printed Circuit Board Designing System Based on Artificial Intelligence Techniques", National Technical Report, vol. 39, No. 2, Apr. 1993, pp. 84–89.

Primary Examiner—Kevin J. Teska
Assistant Examiner—Tan Q. Nguyen
Attorney, Agent, or Firm—Price Gess & Ubell

[57] ABSTRACT

According to the printed-circuit board of the preset invention, the circuit modification unit 120 adds a noise reduction component, based on circuit board information inputted to the design information input unit 106. Then, the layout unit 132 sets a layout after the design rule generation unit 133 generates a design rule. The rated value modification unit 124 determines rated values of noise reduction components in accordance with the layout. Thus, design rule generation, noise reduction component addition, and rated value determination are automatically performed to satisfy the electric characteristics of evaluation targets. Consequently, interactive process in designing is reduced and the efficiency of designing can be realized.

47 Claims, 10 Drawing Sheets signal line
clock frequency 30MHz number of layers : 4
board dielectric constant : 0.5

FIG. 8a  input
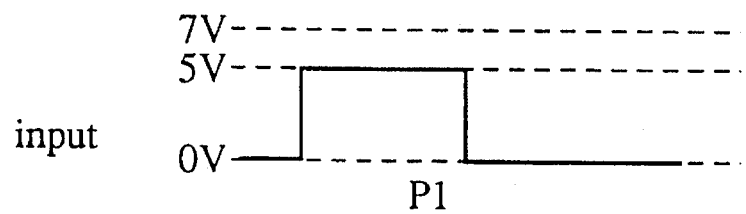
FIG. 8b  without noise reduction component
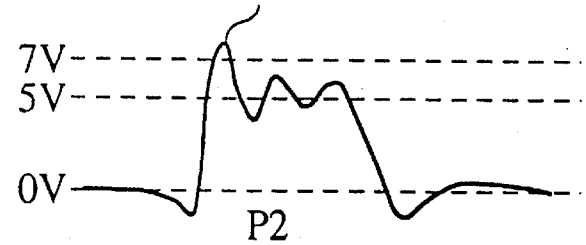
FIG. 8c  terminal resistance 201 51 Ω
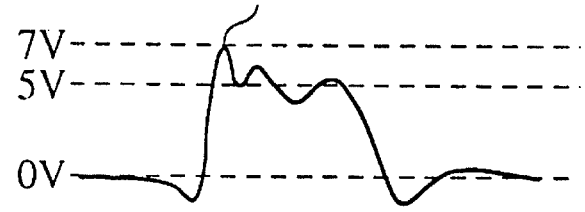
FIG. 8d  terminal resistance 202 75 Ω
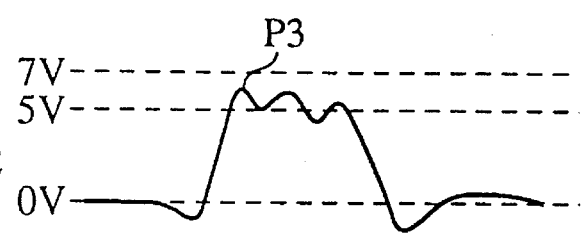

SYSTEM AND METHOD FOR DESIGNING A PRINTED-CIRCUIT BOARD

BACKGROUND OF THE INVENTION

(1) Field of the Invention

The present invention relates to a system and method for designing a circuit board including a printed-circuit board or a multi-chip module (MCM), with the use of a CAD (computer aided design) system.

(2) Description of the Related Art

FIG. 1 is a flowchart depicting a conventional process of designing a printed-circuit board with the use of a CAD system.

First of all, the designer designs an electric circuit showing the electric connection among all the components to be mounted on the printed circuit board, with the use of CAD for circuits (step 2101). To be more specific, the designer designs a fundamental electric circuit (step 2102), and adds noise reduction components which are necessary for preventing reflection, delay, and noise (step 2103).

Then, a net list having information on the electric connection is inputted to CAD for printed circuit boards, to interactively set a layout. The layout includes the placement of components and the connection of routing pattern (step 2104).

The designer then examines whether the printed-circuit board (hereinafter PC board) properly operates as is expected. The examination may be done through a simulation or by actually producing a PC board and applying a probe (steps 2105 and 2106).

As a result, it may be found that the PC board does not work properly or cannot put out expected performance due to electric characteristics such as signal delay, noise, or electromagnetic radiation. In such a case, the designer modifies the rated value, such as the resistance value or capacity value of each noise reduction component (step 2108), and examines through a simulation whether the PC board operates as is expected (steps 2105, 2106, and 2107).

In the case that the PC board still does not work properly or cannot put out expected performance, the layout including the placement of components and routing foils or route length is modified (step 2104), and it is examined whether the board works properly as is expected (steps 2105, 2106, 2107, and 2109).

If the PC board still does not work properly or cannot put out expected performance, additional noise reduction components such as a resistance or capacitor are provided (step 2103), and the PC board is examined through a simulation or another method whether it works properly as is expected (steps 2104, 2105, and 2106).

Through these steps, the designer applies the PC board with appropriate counterparts to make the electric performance sufficient. The steps 2105 to 2108, steps 2104 to 2109, and steps 2103 to 2106 may not be necessarily proceeded in these orders because they are carried out interactively. It is also possible to go back to step 2102, if needed, to design the fundamental electric circuit.

Thus, realizing that the PC board operates properly, the designer forwards the obtained PC board design information to the production process.

Some CAD systems are provided with a function of automatically setting a layout (National Technical Report Vol. 39 No. 2 Apr. 1993, "High-Density Printed Circuit Board Designing System Based on Artificial Intelligence Techniques", pp. 84–89, published by Matsushita Electric Industry). However, the high-density printed circuit board designing system does not take it into account to add noise reduction components to the circuit or modify the layout and the rated values of the noise reduction components, in accordance with the electric characteristics of the PC board which has been automatically set a layout. Consequently, the designer needs to perform the examination of the electric characteristics of the PC board and corresponding correcting process interactively.

U.S. Pat. No. 5,187,668 discloses a placement optimization system aided by CAD. This system does not take the electric characteristics of the component-added circuit into account.

U.S. Pat. No. 5,046,017 discloses a routing design for semiconductor integrated circuit, which discloses only the setting of a routing layout in accordance with the electric characteristics, and does not take the modification of the circuit in accordance with the electric characteristics.

Thus, according to the conventional PC boards, it is necessary for the designer to interactively continue the modification of the layout or the rated values of the components, or the addition of noise reduction components, by means of a simulation or another method. These procedures for adding noise reduction components to the circuit requires many man-hours until it has been finally checked that the board operates properly.

The following is a description on the usage of a conventional design rule.

Generally, design rule means restrictions to observe in designing a PC board, in order to properly produce and operate the designed PC board. The following are examples: "close parallel routes are vulnerable to cross talk noise, so that the maximum length of these parallel routes is made 10 centimeters", and "a component, which is inserted with the use of an insert machine, should have 1 centimeter margin on its sides, so as to be held by the machine".

Although these design rules may be slightly different depending on the type of PC boards to be designed or their production methods, if PC boards have different design rules from each other, it not only takes time to form the different design rules, but the designer must design every one of design rule. In view of these inconveniences, design rules are conventionally predetermined depending on the types of PC boards.

Thus, these design rules are predetermined like a greatest common divisor. In other words, PC boards can be produced without any serious problem as far as they observe the design rules, and as a result, some boards are produced with too lenient design rule. For example, a PC board which could have been designed and produced into four layers actually had six layers because it observed the design rule, and another PC board was produced in a larger size than expected. These problems lead to a high production cost, and prevents an apparatus provided with such a PC board from being minimized.

On the other hand, even a lenient design rule does not necessarily meet the requirements of every PC board. There are cases that a board which satisfies the design rule does not operate properly when it is actually produced.

SUMMARY OF THE INVENTION

The first object of the present invention is to provide a system and method of designing a printed-circuit board with excellent electric characteristics by reducing noise caused in setting a layout of a designed electric circuit on an actual board, and by reducing a workload of a circuit board designer, thereby improving the working efficiency of the designer.

The first object can be achieved by a system and method for designing a circuit board, based on circuit board information, noise reduction information, and evaluation information. The circuit board information indicates a board to be used for a circuit board to be designed, a circuit to be laid out on the board, and components to be included in the circuit. The noise reduction information indicating antinoise solution, the evaluation information indicating electric characteristics of the circuit board in process of designing.

The system comprises the following:

an input device for receiving the circuit board information, noise reduction information, and evaluation information;

a noise reduction component addition device for adding noise reduction components to the circuit described in the circuit board information, based on information on noise reduction components described in the received noise reduction information, and for modifying the circuit board information in accordance with the noise reduction components-added circuit;

a layout device for (1) laying out components and routes on the board described by the circuit board information, based on the circuit board information which has been modified by the noise reduction component addition device, and another information on restrictions to the layout described in the noise reduction information, for (2) generating layout information, using locations of the components and the routes laid out on the board as coordinate values, and for (3) further modifying the circuit board information modified by the noise reduction component addition device in accordance with the laid out circuit;

an evaluation device for evaluating electric characteristics of evaluation targets in the circuit described by the layout information and the circuit board information at that moment, based on the evaluation information on the electric characteristics of the circuit board in the process of designing;

a rated value modification device for replacing the noise reduction components with other noise reduction components having different rated values, based on information on noise reduction components in the noise reduction information, and for modifying the circuit board information in accordance with the circuit having changed rated values;

a control device for starting the evaluation device every time the layout device completes a layout, and for starting the evaluation device every time the rated value modification device changes a rated value of a noise reduction component in the circuit;

an output device for outputting the circuit board information and the layout information when the electric characteristics of predetermined evaluation targets among the evaluation targets in the circuit described in the circuit board information and the layout information have been fairly evaluated by the evaluation device.

The method comprises the following:

a receiving step for receiving the circuit board information, noise reduction information, and evaluation information;

a noise reduction component adding step for adding noise reduction components to the circuit described in the circuit load information, based on information on noise reduction components described in the received noise reduction information, and modifying the circuit board information in accordance with the noise reduction components-added circuit;

a layout step for laying out components and routes on the board described by the circuit board information, based on the circuit board information which has been modified, and another information on restrictions to the layout described in the noise reduction information, generating layout information, using locations of the components and the routes laid out on the board as coordinate values, and further modifying the circuit board information modified in the noise reduction component adding step in accordance with the laid out circuit;

an evaluating step for evaluating electric characteristics of evaluation targets in the circuit described by the layout information and the circuit board information at that moment, based on the evaluation information on the electric characteristics of the circuit board in the process of designing;

a rated value modifying step for replacing the noise reduction components with other noise reduction components having different rated values, based on information on noise reduction components in the noise reduction information, and for modifying the circuit board information in accordance with the circuit having changed rated values; and an output step for outputting the circuit board information and the layout information when the electric characteristics of predetermined evaluation targets among the evaluation targets in the circuit described in the circuit board information and the layout information have been fairly evaluated.

The second object of the present invention is to provide a system and method of designing a printed-circuit board capable of automatically performing a layout having high flexibility and of preventing noise reduction components that are important from the view point of the electric characteristics of the printed-circuit board to be designed from being deleted.

The second object can be achieved when the noise reduction component addition device comprises the following:

a noise reduction component-added-position recognition unit for recognizing a position which is supposed to be added a noise reduction component by comparing information indicating a position on the circuit to be added a noise reduction component, the information belonging to the noise reduction information with the inputted circuit board information; a noise reduction component recognition unit for recognizing a noise reduction component which has been already added to a position recognized by the noise reduction component-added-position recognition unit;

a noise reduction component addition unit for adding a noise reduction component to the recognized position that has not been added a noise reduction component yet, based on information indicating a noise reduction component to be added and another information indicating a rated value of the noise reduction component to be added;

a priority assigning unit for assigning priorities to the noise reduction components recognized by the noise reduction component recognition unit and a noise reduction component newly added by the noise reduction component addition unit;

and a first circuit board information modification unit for adding the information indicating the priorities to the information describing the noise reduction components in the circuit board information, and for, when the noise reduction component addition unit has newly added a noise reduction component, modifying the inputted circuit board information in accordance with the circuit having the newly added noise reduction component; and when the layout device comprises the following:

a layout area recognition unit for recognizing an area on the board which is described in the circuit board information and which can lay out components included in the circuit described in the circuit board information modified by the first circuit board information modification unit and routes to connect the components;

a layout unit for laying out the components included in the circuit described in the circuit board information and the routes to connect the components, in accordance with a restriction to the layout described in the noise reduction information, the components and the routes being laid out on the area recognized by the layout area recognition unit;

a layout judging unit for judging whether or not the layout of all necessary components and routes can be completed;

a noise reduction component deletion unit for sequentially deleting deletable noise reduction components in the circuit described in the circuit board information modified by the first circuit board information modification unit, starting at a noise reduction component which has been assigned a lowest priority, when the layout has been judged not to be able to be completed;

a layout information generation unit for generating layout information, using as coordinate values locations of the components and the routes laid out on the board by the layout unit;

a second circuit board information modification unit for further modifying the circuit board information modified by the first circuit board information modification unit by adding information indicating deleted noise reduction components to the information describing noise reduction components included in the circuit of the circuit board information;

a layout control unit for starting the layout area recognition unit, layout unit, and layout judging unit every time the noise reduction component deletion unit deletes a noise reduction component.

The second object can be achieved also when the noise reduction component adding step comprises the following:

a noise reduction component added-position recognizing sub step for recognizing a position which is supposed to be added a noise reduction component by comparing information indicating a position on the circuit to be added a noise reduction component, the information belonging to the noise reduction information with the inputted circuit board information, a noise reduction component recognizing sub step for recognizing a noise reduction component which has been already added to a position recognized in the noise reduction component-added-position recognizing sub step;

a noise reduction component adding sub step for adding a noise reduction component to the recognized position that has not been added a noise reduction component yet, based on information indicating a noise reduction component to be added and another information indicating a rated value of the noise reduction component to be added;

an assigning sub step for assigning priorities to the noise reduction components recognized in the noise reduction component recognizing sub step and a noise reduction component newly added in the noise reduction component adding sub step;

and a first circuit board information modifying sub step for first adding the information indicating the priorities to the information describing the noise reduction components in the circuit board information, and when the noise reduction component adding sub step has newly added a noise reduction component, modifying the inputted circuit board information in accordance with the circuit having the newly added noise reduction component; and when the layout step comprises the following:

a layout area recognizing sub step for recognizing an area on the board which is described in the circuit board information and which can lay out components included in the circuit described in the circuit board information modified in the first circuit board information modifying sub step and routes to connect the components;

a layout sub step for laying out the components included in the circuit described in the circuit board information and the routes to connect the components, in accordance with a restriction to the layout described in the noise reduction information, the components and the routes being laid out on the area recognized in the layout area recognizing sub step;

a layout judging sub step for judging whether or not the layout of all necessary components and routes can be completed;

a noise reduction component deletion sub step for sequentially deleting deletable noise reduction components in the circuit described in the circuit board information modified in the first circuit board information modifying sub step, starting at a noise reduction component which has been assigned a lowest priority, when the layout has been judged not to be able to be completed; for executing operations of the layout sub step every time a noise reduction component is deleted, continuing the deleting operation until a layout has been judged to be able to be completed in the layout judging sub step, and for, when the completion of a layout has been judged to be impossible even after all the deletable noise reduction components are deleted, outputting the situation;

a layout information generating sub step for generating layout information, using as coordinate values locations of the components and the routes laid out on the board in the layout sub step; and a second circuit board information modifying sub step for further modifying the circuit board information modified in the first circuit board information modifying sub step by adding information indicating deleted noise reduction components to the information describing noise reduction components included in the circuit of the circuit board information, every time a noise reduction component is deleted in said noise reduction component deletion sub step.

The rated value modification device may further comprise the following:

a rated value modification unit for replacing the noise reduction components added to the evaluation targets whose electric characteristics have been poorly evaluated by the evaluation means, with other noise reduction components having different rated values, based on information described in the noise reduction information: (1) information indicating noise reduction components which can be replaced by other noise reduction components having different rated values, (2) information indicating a range of the different rated values; and a third circuit board information modification unit for modifying the circuit board information modified by the second circuit board information modification unit in accordance with the circuit including a noise reduction component having a modified rated value.

The third object of the present invention is to provide a system and method of designing a printed-circuit board capable of modifying a part of a laid out circuit, which has poor electric characteristics.

The third object can be achieved when the system which can achieve the first object further comprises the following:

a layout modification control unit for starting the layout device to lay out again the circuit described in the circuit board information at that point onto a location different from a location described in the layout information, when electric characteristics of a predetermined evaluation target have not been fairly evaluated by the evaluation device, even after all modifiable rated values of noise reduction components are modified;

a deleted noise reduction component re-addition unit for re-adding the deleted noise reduction components to evaluation targets whose electric characteristics have been poorly evaluated, the addition starting at a noise reduction component assigned a highest priority;

priority order change unit for changing an order of priorities assigned to the re-added noise reduction components into a different order indicating impossibility of deleting the noise reduction components;

a fourth circuit board information modification unit for (1) changing information added by the second circuit board information modification unit, the information indicating that a noise reduction component has been deleted, into information indicating the deleted noise reduction component has been re-added, and for (2) changing a priority order in the information describing noise reduction components into the priority order changed by the priority order change unit; and deleted noise reduction component re-addition control unit for (1) putting the rated value modification unit stand-by after a completion of a layout by the layout device based on a direction of the layout modification control unit, and an evaluation performed by the evaluation device subsequent to the layout, for (2) starting the layout device every time the deleted noise reduction component re-addition control device re-adds a deleted noise reduction component to the circuit, and for (3) starting the rated value modification unit if the evaluation device does not fairly evaluate the electric characteristics of a predetermined evaluation target in the circuit to which all noise reduction components that can be re-added have been re-added.

The third object can be also achieved when the rated value modifying step further comprises the following:

a rated value modifying sub step for repeating an evaluating operation in the evaluating step every time a noise reduction component added to the evaluation target whose electric characteristics have been poorly evaluated in the evaluating step is replaced with other noise reduction components having different rated values, based on information described in the noise reduction information: (1) information indicating noise reduction components which can be replaced by other noise reduction components having different rated values, (2) information indicating a range of the different rated values, and continuing the replacement until the electric characteristics of the evaluation target is fairly evaluated in the evaluating step; and a third circuit board information modifying sub step for modifying the circuit board information modified in the second circuit board information modifying step in accordance with the circuit including a noise reduction component having a modified rated value;

a layout modifying sub step for starting the layout step to lay out again the circuit described in the circuit board information at that point onto a location different from a location described in the layout information, when electric characteristics of a predetermined evaluation target have not been fairly evaluated in the evaluating step, even after all modifiable rated values of noise reduction components are modified;

a deleted noise reduction component re-adding step for making the evaluating step evaluate all evaluation targets included in the circuit which has been laid out again in the layout step, for re-adding the deleted noise reduction components to evaluation targets whose electric characteristics have been poorly evaluated, starting at a noise reduction component assigned a highest priority, executing the layout step to lay out re-added noise reduction components every time a noise reduction component is re-added and evaluating the laid out circuit, thus continuing the re-adding operation until the electric characteristics of the predetermined evaluation targets are fairly evaluated;

priority order changing unit for changing an order of priorities assigned to the re-added noise reduction components into a different order indicating impossibility of deleting the noise reduction components, every time a noise reduction component is re-added;

a fourth circuit board information modifying step for (1) changing information added in the second circuit board information modifying sub step, the information indicating that a noise reduction component has been deleted, into information indicating the deleted noise reduction component has been re-added, the information being in the circuit board information modified in the second circuit board information modifying sub step, every time a noise reduction component is re-added; and wherein when the electric characteristics of all the evaluation targets in the circuit to which the once deleted noise reduction components have been re-added are not fairly evaluated, sub steps from the rate value modifying sub step to the fourth circuit board information modifying step are repeated until the electric characteristics of the predetermined valuation targets are fairly evaluated.

The fourth object of the present invention is to provide a system and method of designing a printed-circuit board capable of taking precautions against noise at the stage of designing a circuit prior to the layout.

The fourth object can be achieved when the noise reduction component addition device further comprises the following:

a first circuit evaluation unit for circuit-simulating a part including the recognized noise reduction component-to-be-added position in a circuit, the part being a circuit evaluation target described in the evaluation information, thereby determining whether an output of the circuit simulation for the circuit evaluation target satisfies a circuit evaluation rule described in the evaluation information, and for, when the circuit evaluation target does not satisfy the circuit evaluation rule, making the noise reduction component addition unit add a predetermined noise reduction component to the recognized noise reduction component-to-be-added position, based on the information indicating noise reduction components to be added, and the information indicating a rated value of the noise reduction component to be added.

The fourth object can be also achieved when the noise reduction component adding step further comprises the following:

a first circuit evaluating sub step for circuit-simulating a part including the recognized noise reduction component-to-be-added position in a circuit, thereby determining whether an output of the circuit simulation for the circuit evaluation target satisfies a predetermined circuit evaluation rule, and for, when the circuit evaluation target does not satisfy the circuit evaluation rule, adding a predetermined noise reduction component to the noise reduction component-to-be-added position recognized in the noise reduction component recognizing sub step, based on the information indicating noise reduction components to be added, and the information indicating a rated value of the noise reduction component to be added.

The noise reduction component addition device may further comprise the following:

a second circuit evaluation unit for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modification unit for replacing all noise reduction components having changeable rated values with other noise reduction components having different rated values when the second circuit evaluation unit poorly evaluated the electric characteristics of the part of the circuit; and a noise reduction component rated value modification control unit for making the circuit evaluation unit evaluate the electric characteristics of the part including the noise reduction components having the different rated values, every time a noise reduction component is replaced with another noise reduction component having a different rated value.

The noise reduction component adding step may further comprise the following:

a second circuit evaluation sub step for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modifying sub step for replacing all noise reduction components having changeable rated values with other noise reduction components having different rated values when the electric characteristics of the part of the circuit have been poorly evaluated in the second circuit evaluating step, for circuit simulating a part including a noise reduction component replaced by another noise reduction component having a different rated value, for continuing the changing operation of rated values and the evaluating operation in the second circuit evaluating sub step until the electric characteristics of all the evaluation targets are fairly evaluated in the circuit evaluating sub step.

The fifth object of the present invention is to provide a system and method of designing a printed-circuit board capable of deleting noise reduction components when the rated values of replaced noise reduction components either become small enough to ignore the noise reduction components themselves or become large to dispense with the noise reduction components.

The fifth object can be achieved when the rated value modification device further comprises the following:

a garbage noise reduction component recognition unit for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, the information being described in the inputted noise reduction information, and for recognizing, as garbage noise reduction component, the noise reduction component whose rated value has been put in the range of the rated value indicated in the information; and a garbage noise reduction component deletion unit for deleting noise reduction components recognized by the garbage noise reduction component recognition unit and for modifying the circuit board information in accordance with the circuit from which the noise reduction components have been deleted as garbage noise reduction components, and for starting the layout device.

The fifth object can be also achieved when the rated value modifying step further comprises the following:

a garbage noise reduction component recognizing sub step for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, the information being described in the inputted noise reduction information, and for recognizing, as garbage noise reduction component, the noise reduction component whose rated value has been put in the range of the rated value indicated in the information; and a garbage noise reduction component deleting sub step for deleting noise reduction components recognized by the garbage noise reduction component recognizing sub step, and for modifying the circuit board information in accordance with the circuit from which the noise reduction components have been deleted as garbage noise reduction components.

The sixth object of the present invention is to provide a system and method of designing a printed-circuit board capable of generating a design rule, which is predetermined like a greatest common divisor per a predetermined group such as production units or types of the board.

The sixth object can be achieved when the system which can achieve the first object further comprises the following:

a design rule generation information input unit for receiving design rule generation information which indicates targets for which to generate design rules and also indicates a parameter for determining an allowable range of values for the targets such as a length of parallel routes, the design rules being restrictions in laying out a circuit on the board, described in inputted circuit board information;

design rule Generation unit for simulating a design rule generation target predetermined in accordance with the design rule generation information every time a possible value of the design rule generation target is changed by every predetermined value under the parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and design rule output unit for, when the result of the simulation does not satisfy the predetermined design rule generation evaluation standard even if the value of the design rule is changed to every possible value within the range, outputting a situation, and for outputting the generated design rule and for directing the layout device to set a layout based on the generated design rule, when the result of the simulation satisfies the predetermined design rule generation evaluation standard.

The sixth object can be also achieved by the method further comprising the following:

a design rule generation information input sub step for receiving design rule generation information which indicates targets for which to generate design rules and also indicates a parameter for determining an allowable range of values for the targets such as a length of parallel routes, the design rules being restrictions in laying out a circuit on the board, described in inputted circuit board information;

a design rule generating sub step for simulating a design rule generation target predetermined in accordance with the design rule generation information every time a possible value of the design rule generation target is changed by every predetermined value under the parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and a design rule output sub step for, when the result of the simulation does not satisfy the predetermined design rule generation evaluation standard even if the value of the design rule is changed to every possible value within the range, outputting the situation, and for outputting the generated design rule and for directing the layout step to set a layout based on the generated design rule, when the result of the simulation satisfies the predetermined design rule generation evaluation standard.

The seventh object of the present invention is to provide a system and method of designing a printed-circuit board with further excellent electric characteristics than the printed-circuit board of the first object.

The seventh object can be achieved when the evaluation device comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by the evaluation device including a transmission line simulation carried out by the transmission line simulator.

The seventh object can be also achieved when the evaluating step comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by the evaluating step being a transmission line simulation carried out by the transmission line simulator.

The evaluation device may further comprise the following:

an evaluation rule storage unit for storing types of noise reduction components added in the circuit including the evaluation targets and a range of rated values of the added noise reduction components, for every predetermined evaluation target;

evaluation target recognition unit for recognizing an evaluation target in the circuit described by the layout information and the circuit board information at that point, based on information described in the evaluation information indicating an evaluation target in the laid out circuit; and an evaluation unit for evaluating the electric characteristics of the evaluation targets by determining whether or not the types and rated values of the noise reduction components satisfy the evaluation rule stored in the evaluation storage unit.

The evaluation step may further comprise the following:

evaluation target recognizing step for storing types of noise reduction components added in the circuit including the evaluation targets and a range of rated values of the added noise reduction components to memory for every predetermined evaluation target and for recognizing an evaluation target in the circuit described by the layout information and the circuit board information at that point, based on information described in the evaluation information indicating an evaluation target in the laid out circuit; and an evaluating sub step for evaluating the electric characteristics of the evaluation targets by determining whether or not the types and rated values of the noise reduction components satisfy the evaluation rule stored in the memory.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 8(a) shows a waveform to be inputted to the net shown in FIGS. 7(a)–(c) through a simulation.

FIG. 8(b) is a waveform to be taken out on the side of input pins of the net shown in FIGS. 7(a) as a result of the simulation.

FIG. 8(c) is a waveform to be taken out on the side of input pins of the net shown in FIGS. 7(b) as a result of the simulation.

FIG. 8(d) is a waveform to be taken out on the side of input pins of the net shown in FIGS. 7(c) as a result of the simulation.

DESCRIPTION OF THE PREFERRED EMBODIMENT

<EMBODIMENT 1>

The system and method for designing a circuit including a printed-circuit board according to this embodiment will be described with reference to FIGS. 2 through 11 as follows.

Figure 1:
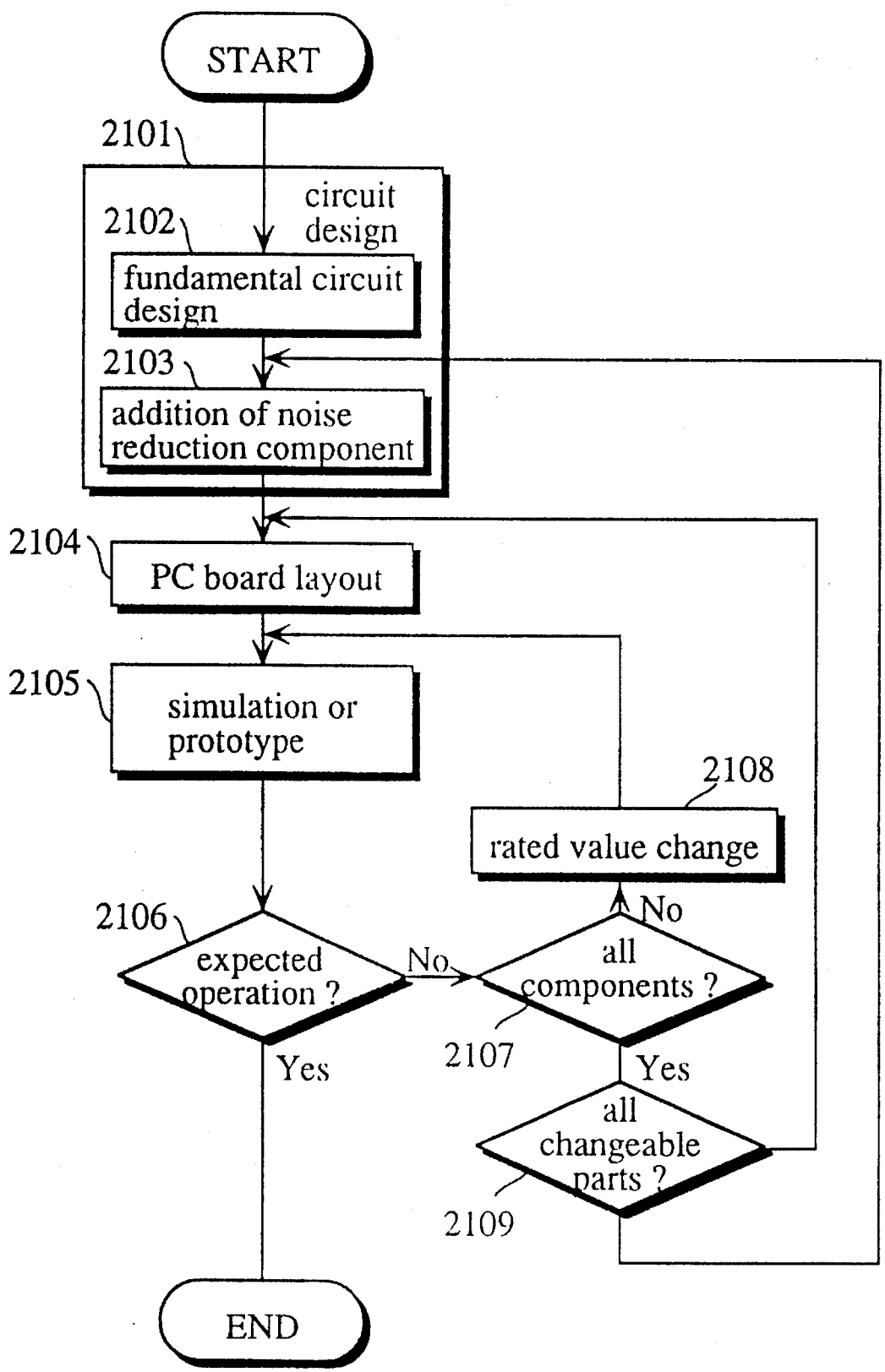
FIG. 1 is a flowchart depicting a conventional process of designing a printed-circuit board with the use of a CAD system.
Figure 2:
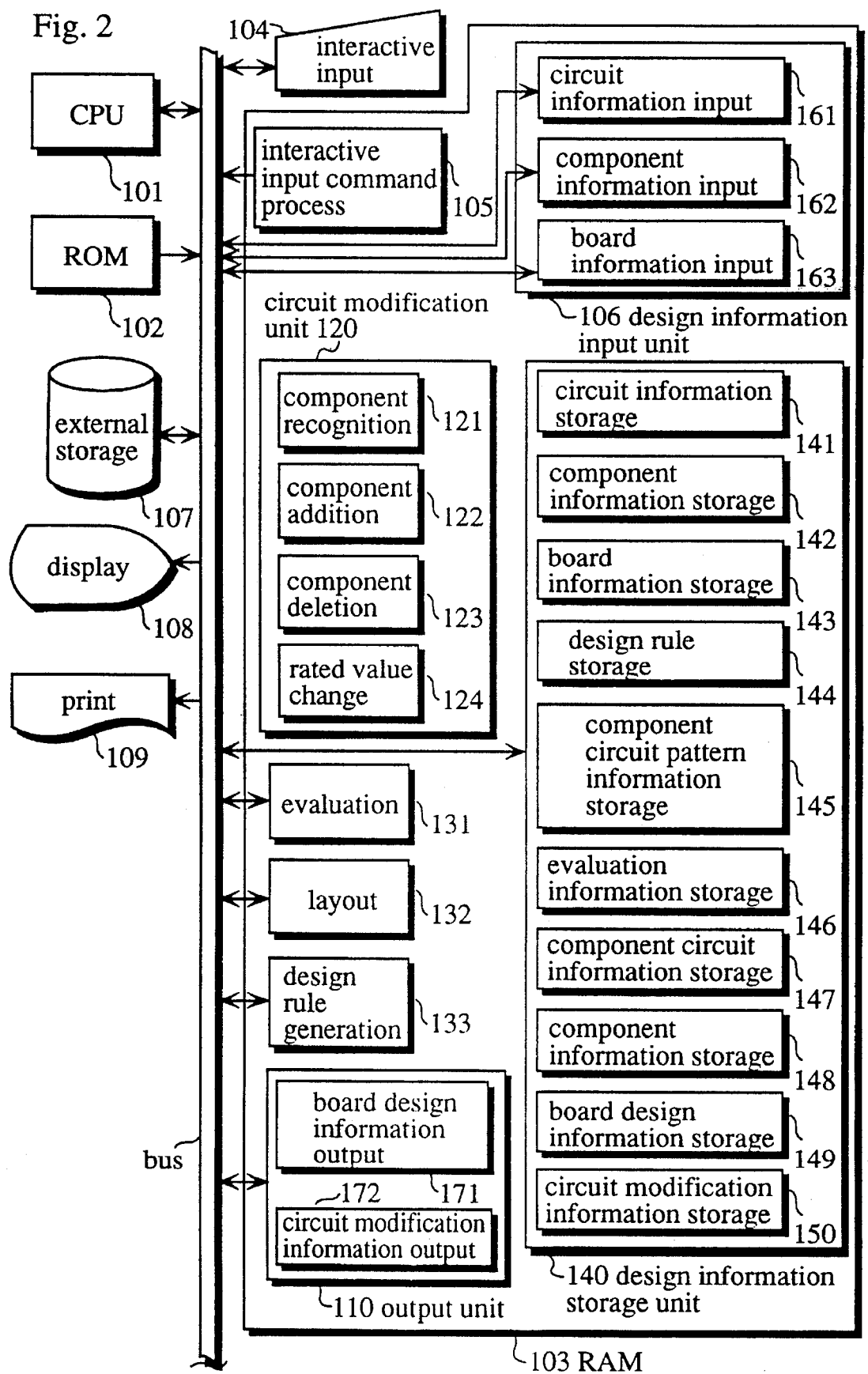
FIG. 2 is a diagram showing the PC design system of the embodiment of the present invention.

FIG. 2 is a diagram showing the PC design system of this embodiment. The system is composed of a CPU 101, a ROM 102, a RAM 103, a interactive input unit 104, an external storage unit 107, a display unit 108, and a print unit 109.

The RAM 103 stores a program for realizing the functions of an interactive input command process unit 105, a design information input unit 106, an output unit 110, a circuit modification unit 120, an evaluation unit 131, a layout unit 132, and a design rule generation unit 133. These functions are realized by the CPU 101 executing the program stored in the RAM 103. The RAM 103 includes a storage area for a design information storage unit 140.

The design information input unit 106 includes a circuit information input unit 161, a component information input unit 162, and a board information input unit 163.

The output unit 110 includes a board design information output unit 171 and a circuit modification information output unit 172.

The circuit modification unit 120 includes a noise reduction component recognition unit 121, a noise reduction component addition unit 122, a noise reduction component deletion unit 123, and a rated value modification unit 124.

The design information storage unit 140 is composed of a circuit information storage unit 141, a component information storage unit 142, a board information storage unit 143, a design rule storage unit 144, a noise reduction component circuit pattern information storage unit 145, an evaluation information storage unit 146, a noise reduction component circuit information storage unit 147, a noise reduction component information storage unit 148, a board design information storage unit 149, and a circuit modification information storage unit 150.

The CPU 101 executes programs stored in the ROM 102 and the RAM 103.

The interactive input unit 104, which is a keyboard or a mouse, interactively receives information from the designer.

The interactive input command process unit 105 sequentially inputs information obtained from the interactive input unit 104 to the PC design system by means of an interrupt process, at the stage where a PC board is being designed.

The design information input unit 106 receives design information required for designing a PC board.

The circuit information input unit 161 receives circuit information on the connection among the components from logical information produced by means of an external device, or CAD for circuits. The circuit information can be received as it is or after being applied data conversion.

The component information input unit 162 receives component information including the name, shape, or electric characteristics of each component. The board information input unit 163 receives board information including the shape, material, and thickness of the board, number of layers, dielectric constant, routing foil width, and routing foil interval of a board. Any requirement which the designer wants to designate as a design rule can be included in a design rule which is formed in the design rule generation unit 133, by previously providing to the board information a requirement which the designer wants to designate. The component information input unit 162 and the board information input unit 163 read out component information and board information respectively from the external storage unit 107.

The external storage unit 107, which is a magnetic disk or the like, stores component information, board information, design rules, noise reduction component circuit pattern information, evaluation information or the like as files. The board design system reads out these different information when the system is started, and write into the component information storage unit 142, the board information storage unit 143, the design rule storage unit 144, the noise reduction component circuit pattern information storage unit 145, and the evaluation information storage unit 146 respectively.

The external storage unit 107 also stores board design information and circuit modification information which are the results designed by the PC board design system. A CAD for other PC board layout and a CAM for production read out board design information and circuit modification information which are stored as files in the external storage unit 107.

The display unit 108, which is a CRT or the like, sequentially displays the designing conditions of the PC board of the PC design system. If the designed PC board cannot meet the required electric characteristics at the stage of designing the PC board, the display unit 108 displays the condition. Furthermore, the board design information and circuit modification information are displayed when the designing has been completed.

The print unit 109, which is an external output device such as a printer, outputs the board design information and circuit modification information onto paper, in the form of prints. The output of the print unit 109 may be in the form of circuits or logical information.

The output unit 110 outputs the results of the board design to each of the external storage unit 107, the display unit 108, and the print unit 109 after applying data conversion in accordance with the output form of each unit.

The board design information output unit 171 outputs the finally produced PC board design information in the form of display, print, or converted data to be available to a system such as another CAD or CAM.

The circuit modification information output unit 172 outputs component information of a noise reduction component which the circuit modification unit 120 has added or deleted, and the rated value of the noise reduction component which the circuit modification unit 120 has modified, to the external storage unit 107, the display unit 108, and the print unit 109, after applying data conversion in accordance with the output form of each unit. The rated value of a noise reduction component which the circuit modification unit 120 has modified can be the value after the data conversion or the difference from the rated value before the data conversion.

The circuit modification unit 120 performs a transmission line simulation by initiating the evaluation unit 131 after the layout unit 132 has completed a layout of the PC board. Then, the circuit modification unit 120 modifies the circuit to which a layout has been set, in order to meet the required electric characteristics.

The noise reduction component recognition unit 121 checks circuit information with noise reduction component circuit pattern information, thereby recognizing a position in the circuit to which a noise reduction component should be added. The noise reduction component recognition unit 121 further recognizes components which have been already added as noise reduction components, and writes to the noise reduction component circuit information storage unit 147, positions on which noise reduction components have been already added and positions to which noise reduction components have not been added yet, as noise reduction component circuit information.

The noise reduction component addition unit 122 receives the noise reduction component circuit information from the noise reduction component circuit information storage unit 147, and adds noise reduction components, based on the noise reduction component information stored in the noise reduction component information storage unit 148. In this case, the noise reduction component addition unit 122 assigns priorities to newly added noise reduction components, and writes the component information for the newly added noise reduction components to the noise reduction component information storage unit 148.

When the layout unit 132 cannot lay out all the components on the board, the noise reduction component deletion unit 123 refers to the component information stored in the noise reduction component information storage unit 148 to delete components having lower priorities. At this point, the noise reduction component deletion unit 123 writes information on deleted components to the noise reduction component information storage unit 148.

The rated value modification unit 124 starts the evaluation unit 131 to evaluate the output of a position to be evaluated, based on the layout information of the PC board such as the width and material of each routing foil, and route length. Then, the rated value modification unit 124 determines a resistance value and a capacity value which have been added and predetermined as noise reduction components.

The evaluation unit 131 performs a transmission line simulation by means of a well known method after the layout unit 132 has completed a layout of the PC board. The evaluation unit 131 compares the output value of the evaluated position stored in the evaluation information storage unit 146 with the evaluation rule value, thereby evaluating whether the output value is within the evaluation rule. The transmission line simulation can be a cross talk simulation, electromagnetic radiation (EMI) simulation, timing simulation, or any combination of these simulations.

The evaluation unit 131 may perform evaluation of the electric characteristics of the laid out circuit without a simulation. In this case, the evaluation unit 131 refers to a database for evaluation stored in the external storage unit 107. The database stores a predetermined evaluation target, types of the noise reduction components added to the evaluation target, and the allowable range of rated values for the noise reduction components in the form of a table. An example of the information is "when a signal line is connected to an input pin of a component which might be broken if the signal level to be inputted is over 7 V, and when the signal to be inputted is 5 V, then the terminal resistance to be provided to the signal line is made 70 to 80Ω". Having read out, as an evaluation target, "a signal line connected to an input pin of a component which might be broken if the signal level to be inputted is over 7 V", then the evaluation unit 131 recognizes the evaluation target described in the circuit information at that time, thereby recognizing the rated value of the terminal resistance connected to the evaluation target. The evaluation unit 131 compares the recognized rated value with the range of the rated value stored in the table, thereby fairly evaluating the electric characteristics of the evaluation target if the rated value is within the range.

The layout unit 132 performs a board layout including the placement of components and routing pattern, based on the component information and design rule such as the outline or material of the board, the number of layered routing, the thickness of each layer, and the width and intervals of routing foils.

If there are any component or routes that cannot be added to the board, the layout unit 132 starts the noise reduction component deletion unit 123 to delete noise reduction components having lower priorities, and sets a layout again. The designer may perform some modification in the process of a layout, interactively with the interactive input unit 104. Every time a layout is modified, the layout unit 132 rewrites board design information in the board design information storage unit 149, thereby outputting the finally determined board design information to the board design information output unit 171.

The design rule generation unit 133 generates the design rule of a PC board including routing length restriction, from the board information and the component information. The design rule generation unit 133 writes the generated design rule to the design rule storage unit 144.

The design information storage unit 140 stores information required to design each board. The circuit information storage unit 141 stores circuit information, which indicates which pin of which component is connected to which pin of which component. The circuit information includes the name of a net, component identification numbers to be connected by the net, component name, pin identification numbers to be connected, and pin attribute.

Figure 3:
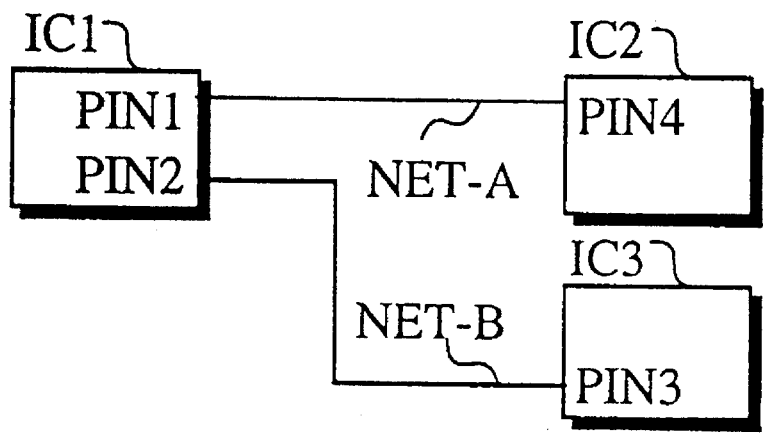
FIG. 3 is a circuit showing the contents of the circuit information to be inputted from the CAD for circuits.

FIG. 3 is a circuit showing the contents of the circuit information to be inputted from the CAD for circuits. PIN 1 of a component IC1 is connected with PIN 4 of a component IC2 via the NET-A, and PIN 2 of the component IC1 is connected with PIN 3 of the component IC3 via the NET-B. NET-A and NET-B are signal lines having 30 MHz of clock frequency.

The component information storage unit 142 stores component information, which includes the shapes and attributes of the components in the circuit. To be more specific, the component information includes the identification number, name, type, and shape of each component, the input/output attribute such as the rising time of pin output, capacity, and electric characteristics of each pin, and the priority order of the components. It is not necessary to indicate the priority order of the components at the stage where a circuit is designed by the CAD for circuits. All the components may be assigned uniform priority at the stage where the component information input unit 162 has received the component information.

The board information storage unit 143 stores board information, which includes the shapes and attributes of a board. To be more specific, the board information includes the shape and number of the board, thickness of layers, and thickness of the board, and the dielectric constant of the board material.

Figure 4:
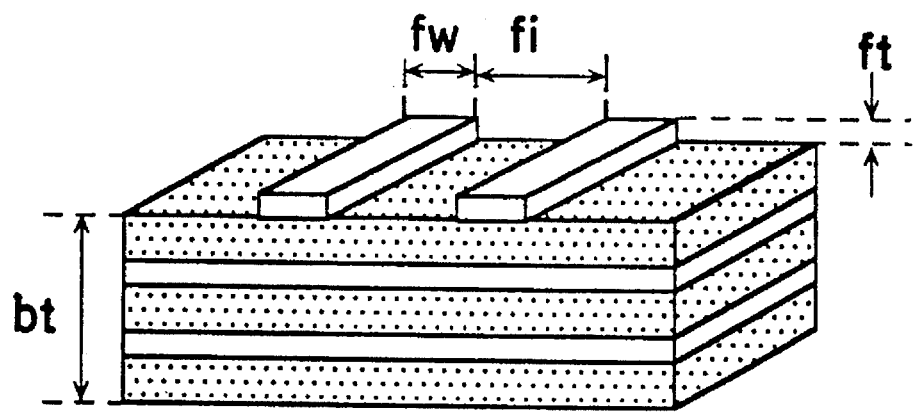
FIG. 4 is a perspective view explaining the contents of the board information.

FIG. 4 is a perspective view explaining the contents of the board information. The board information includes the thickness bt of the board: 0.15 cm, number of layers of the board: 4, the width fw of routing foils: 0.05 mm, thickness ft of routing foils: 0.02 mm, and interval fi of routing foils: 0.1 mm, the dielectric constant of board material: 0.5, material of routing foils, thickness of each layer, and the like.

The design rule storage unit 144 stores design rules and design rule generation information. A design rule describes a rule to observe in designing a board. The design rule can be previously stored as files in the external storage unit 107, then be written to the design rule storage unit 144 by being taken out when the PC board design system is started.

Furthermore, the design rule may be inputted through the interactive input unit 104, when the design rule is generated. The design rule may be changed based on the board information, or may be newly generated by the design rule generation unit 133, based on the board information and component information. The design rule includes information such as the margin each component has and routing length restriction.

The design rule generation information describes requirements such as routing length restriction, to be included in the design rule. The design rule generation information includes information indicating design rule generation targets, parameter determined for every design rule generation target, and the amount of change in attributes which are the design rule generation targets. The design rule generation targets are targets on which to impose restrictions such as routing length.

An example of design rules, include general restrictions to the length of parallel routes, e.g., length of NET-A and NET-B is 10 cm or shorter and to equal length routes, that is, NET-A and NET-B must be equal in length.

Although the design rule is described in sentences in this example, it may be shown in another mode which is used in, or easily converted into the mode used in a target system, when the output is sent to an external device such as a PC board layout system.

The noise reduction component circuit pattern information storage unit 145 stores noise reduction component circuit pattern information. The noise reduction component circuit pattern information describes a net which is to be added a noise reduction component, based on components to be connected and pin attributes. The noise reduction component circuit pattern information, which is previously stored in the external storage unit 107 as files, is written to the noise reduction component circuit pattern information storage unit 145 by being taken out when the PC board design system is started. The noise reduction component circuit pattern information may be interactively inputted through the interactive input unit 104, when the circuit of the board design system is modified.

The noise reduction component circuit pattern information includes types of components to be connected with noise reduction component-added nets, the pin attributes of the components to be connected, types of noise reduction components to be added to the nets, the priority order of the types of noise reduction components to be selected among the types, the priority order in adding and deleting the noise reduction components, temporarily rated values of the noise reduction components, the permissible range for modifying the temporarily rated values, the range of rated values with which the noise reduction components can be deleted, and types of connections of noise reduction components: parallel or serial.

FIG. 6 shows an example of noise reduction component circuit pattern information described in sentences. They may be described in another mode which is used in, or easily converted into the mode used in the target system.

The evaluation information storage unit 146 stores evaluation information. The evaluation information describes positions to be evaluated by the evaluation unit 131 through a simulation, and the evaluation rule for the positions. The evaluation information is previously stored in the external storage unit 107 as files, and is written to the evaluation information storage unit 146 by being taken out when the PC board design system is started. The evaluation information may be interactively inputted through the interactive input unit 104, when the circuit of the board design system is modified.

The evaluation information includes circuits to be simulated by the evaluation unit 131, input signals in the simulation, positions from which outputting waveforms, the results of the simulation are taken out, the evaluation rule values when the output waveforms are evaluated, the permitting range of the values, and the like. components, temporarily rated values of the noise reduction components, the permissible range for modifying the temporarily rated values, the range of rated values with which the noise reduction components can be deleted, and types of connections of noise reduction components: parallel or serial.

The following is an example of noise reduction component circuit pattern information described in sentences. They may be described in another mode which is used in, or easily converted into the mode used in the target system:

- an output of the clock line is provided with a damping resistance (serial resistance)—901;
- an output of a high speed (10 MHz or more) bus is provided with a damping resistance (serial resistance);
- the input unit of the clock line is provided with a terminal resistance (parallel resistance)—902;
- the RAS input unit of DRAM is provided with a terminal resistance (parallel resistance);
- the input unit to high speed (10 MHz or more) is provided with a ferrite bead;
- data buses (high impedance) is pulled up (pull up resistance and power);
- output units from connectors are pulled up (pull up resistance and power).

The evaluation information storage unit 146 stores evaluation information. The evaluation information describes positions to be evaluated by the evaluation unit 131 through a simulation, and the evaluation rule for the positions.

The evaluation information is previously stored in the external storage unit 107 as files, and is written to the evaluation information storage unit 146 by being taken out when the PC board design system is started. The evaluation information may be interactively inputted through the interactive input unit 104, when the circuit of the board design system is modified.

The evaluation information includes circuits to be simulated by the evaluation unit 131, input signals in the simulation, positions from which outputting waveforms, the results of the simulation are taken out, the evaluation rule values when the output waveforms are evaluated, the permitting range of the values, and the like.

The noise reduction component circuit information storage unit 147 stores noise reduction component circuit information. The noise reduction component circuit information checks circuit information that the noise reduction component recognition unit 121 has received from the CAD for circuits, with the noise reduction component circuit pattern information that has been read out of the noise reduction component circuit pattern information storage unit 145. As a result, the noise reduction component circuit information storage unit 147 describes the recognized noise reduction component-to-be-added target net. The noise reduction component circuit information can be interactively inputted by the designer.

The noise reduction component-to-be-added target net is described in the circuit information inputted from the CAD for circuits, and has not been provided with necessary noise reduction components. Consequently, the noise reduction component addition unit 122 adds a noise reduction component to the noise reduction component-to-be-added target net, then rewrites the noise reduction component circuit information.

The noise reduction component circuit information includes the identification number of the noise reduction component-to-be-added target net, candidates of types of noise reduction components to be added to the net, the priority order in selecting noise reduction components among the candidates, the priority order in adding and deleting the noise reduction components, types of connections of noise reduction components: parallel or serial, and methods of connections of noise reduction components in the net: whether a component is disposed near an input pin or an output pin.

The noise reduction component information storage unit 148 stores noise reduction component information. The noise reduction components to be described in the noise reduction component information are the noise reduction component that has been recognized by the noise reduction component recognition unit 121 as noise reduction component or that has been added to the noise reduction component-to-be-added target net by the noise reduction component addition unit 122.

The noise reduction component information includes the identification number, name, type, and shape of a noise reduction component, the attribute and capacity of a pin, the electric characteristics, the current rated values, candidates of types of noise reduction components in the case that they are changed into another type, the priority order among the candidates, the temporary rated values in the case that the noise reduction components are changed into another type, candidates of changed rated value when the rated values are changed, the permissible range in changing the rated values, the priority order when the rated value is changed, the priority order in adding and deleting noise reduction components, and the range of the rated values which allows the noise reduction components to be deleted. The change of rated values can be done by replacing the present noise reduction components with other noise reduction components of the same type having different rated values. Consequently, the noise reduction components to be replaced must be the same shapes as the present noise reduction components.

Figure 5:
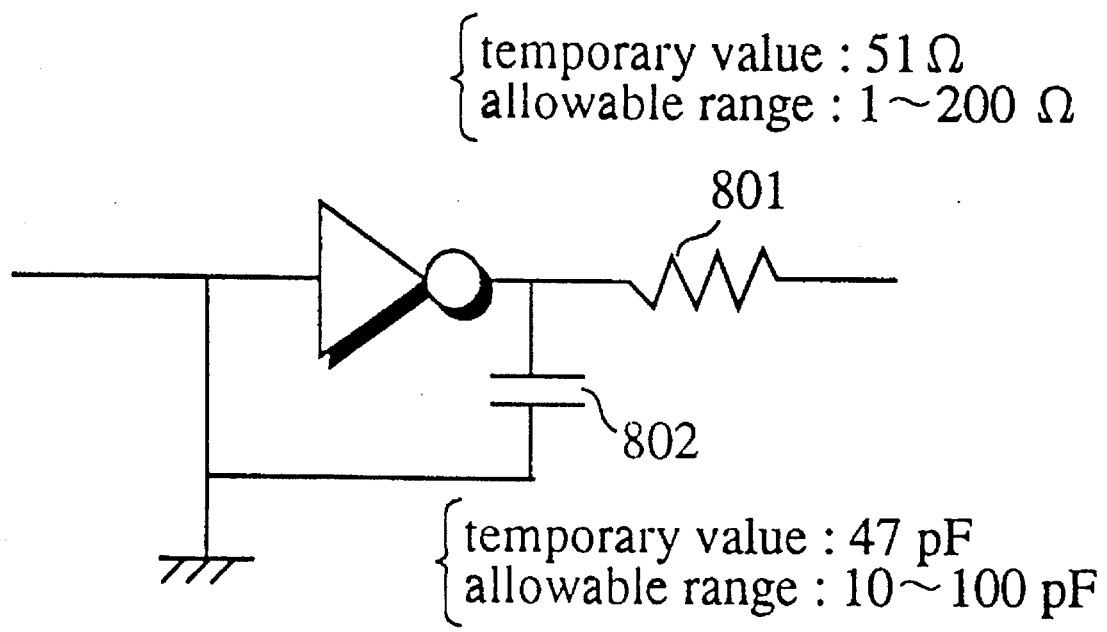
FIG. 5 is a circuit showing an example of setting the permissible range in changing the rated values.

FIG. 5 is a circuit showing an example of setting the permissible range in changing the rated values. FIG. 5 indicates that the resistance value or capacity value of a once added noise reduction component can change in accordance with physical values such as routing length which is determined in the process of the layout. This has been realized by adding the once added noise reduction components with temporary values and permissible ranges. The resistance 801 has a temporary value of 51Ω and a permissible range of 1 to 200Ω. The capacitor 802 has a temporary value of 47 pF and a permissible range of 10 to 100 pF. The temporarily values and permissible ranges are outputted as noise reduction component information and can be used in the process of a layout.

The board design information storage unit 149 stores board design information. The board design information describes the designing results by the PC board design system such as the placement of components and routings. The placement of components is expressed by the coordination position of each component on the board, the board surface on which each component is to be mounted, mounting angle, and the like. The routes are expressed by the coordinate position of routes to connect components on the board, the thickness and width of the routing foils, and the board face to be formed by the routes. The board information including the material and shape of the board, and the material of the routing foils are also outputted as the board design information.

FIG. 6(*a*) is a circuit including circuit information eventually determined by the PC design system. The components IC4 and IC5 are connected with each other via a net whose clock frequency is 30 MHz, having ground and resistance R6 therebetween.

Figure 6A:
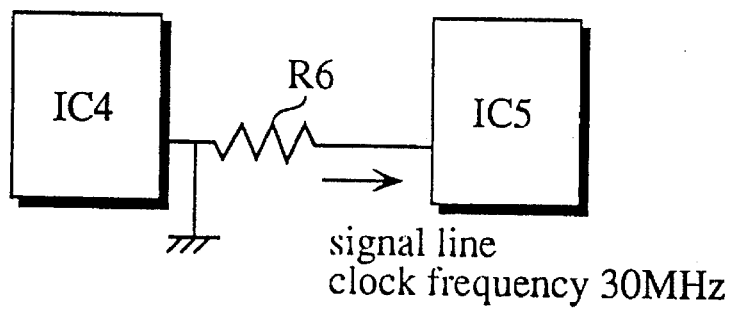
FIG. 6(a) is a circuit including circuit information eventually determined by the PC design system.
Figure 6B:
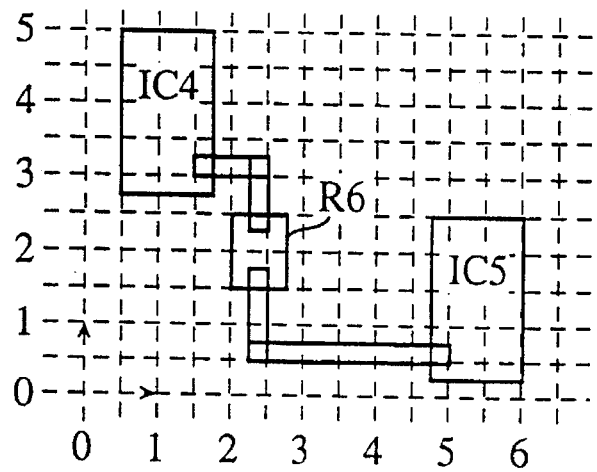
FIG. 6(b) is a plain view showing the placement of a coordination when a layout has been actually set to the circuit on a PC board.

FIG. 6(b) is a plain view showing the placement of a coordination when a layout has been actually set to the circuit on a PC board. The plain view, which is displayed as a drawing to make the explanation easier, actually includes, information on the shape of the board, the shapes and coordination values of the components IC4 and IC5 and resistance R6, the width and connection of routing foils, and their coordination values.

Figure 6C:
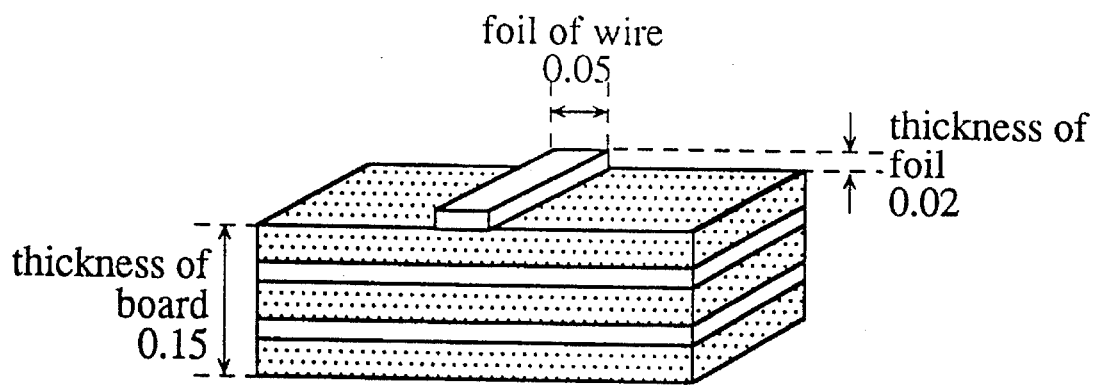
FIG. 6(c) show board information included in the board design information.

FIG. 6(c) show board information included in the board design information. The board information shows the thickness, material, and dielectric constant of the board, and the thickness and width of the routing foils. According to the PC board design system of the present invention, no modification is applied to the board information; however, it is necessary to send the board information to the producing process which is the step following the design process. Consequently, the board information is outputted as part of the board design information.

The board design information to be outputted by the board design information output unit 171 is the information shown in FIGS. 6(b) and 6(c). The information shown in FIG. 6(a) is outputted by the circuit modification information output unit 172, as logical information.

The circuit modification information storage unit 150 stores circuit modification information. The circuit modification information describes circuit information inputted by the circuit modification unit 120 from the CAD for circuits and some modified part of the component information. Here, the component information includes eventual component information on the noise reduction component newly added by the circuit modification unit 120, components whose rated values have been modified, and components which have been modified into other types. As for deleted components, their component identification numbers described in the component information inputted from the CAD for circuits are described. When connection is modified by the modification of a noise reduction component, the modified circuit information is described.

Figure 7A:
FIG. 7(a) is a part of a net in the circuit, which has been recognized as a noise reduction component-to-be-added target net by the noise reduction recognition unit 121.
Figure 7B:
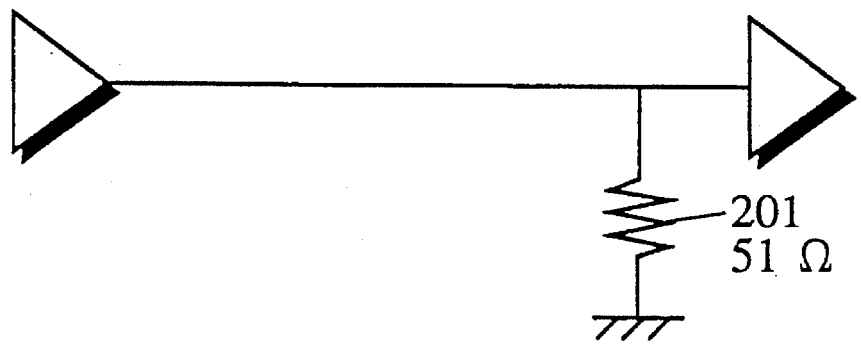
FIG. 7(b) shows an example that the noise reduction component addition unit 122 has provided the net with the reflective noise reduction component.
Figure 7C:
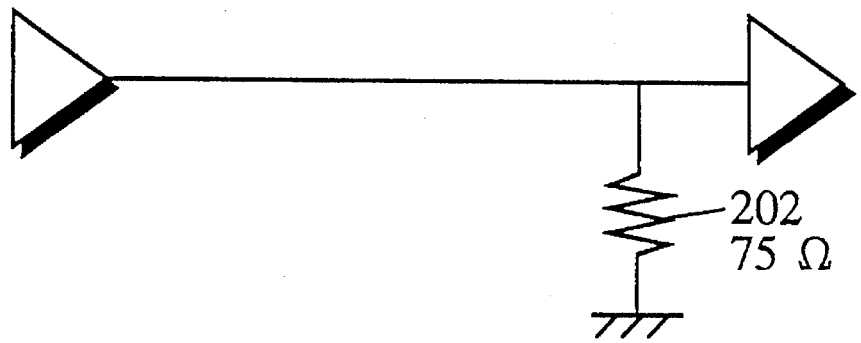
FIG. 7(c) is an example that the rated value modification unit 124 has modified the rated value of the reflective noise reduction component.
Figure 9:
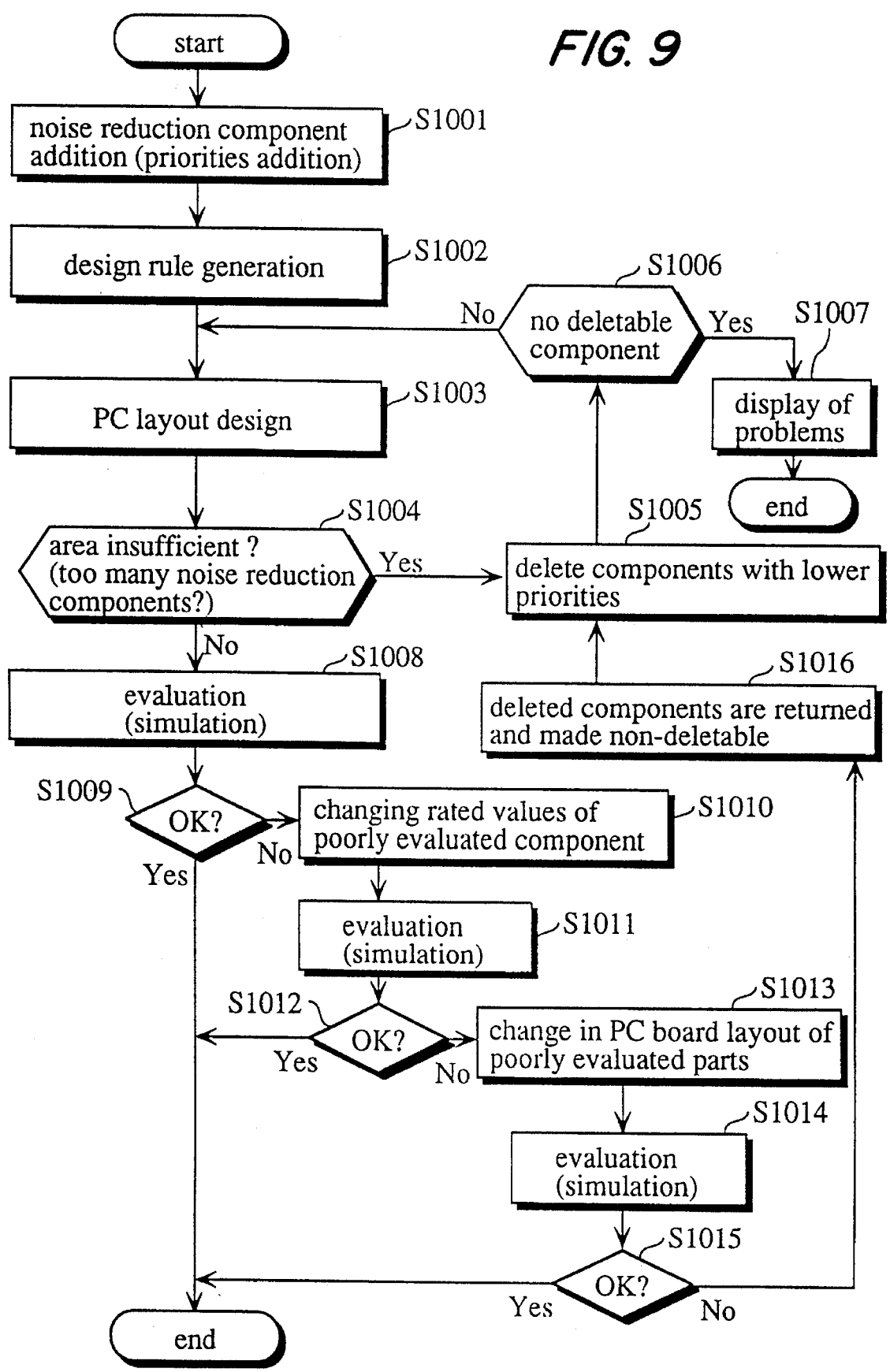
FIG. 9 is a flowchart depicting the procedure of designing the PC board of the embodiment.

FIG. 7(a) is a part of a net in the circuit inputted through the design information input unit 106, and a position to which a noise reduction component is added, which has been recognized as a noise reduction component-to-be-added target net. FIG. 7(b) shows an example that the noise reduction component addition unit 122 has added the reflective noise reduction component to the net. FIG. 7(c) is an example that the rated value modification unit 124 has modified the rated value of the reflective noise reduction component. FIG. 8(a) shows a waveform to be inputted to the net shown in FIGS. 7(a)–(c) through a simulation. FIGS. 8(b)–(d) show waveforms to be taken out on the side of input pins of the net shown in FIGS. 7(a)–(c) as a result of the simulation. FIG. 9 is a flowchart depicting the procedure of designing the PC board of this embodiment.

The net shown in FIG. 7(a) inputs a control signal shown in FIG. 8(a) to an input pin in the circuit which might be broken if the voltage of the control signal is over 7 V. The circuit might be broken if the overshoot of the control signal at the point of P1 is over 7 V as a result that the control signal has a vibrational noise such as ringing shown in FIG. 10, which is caused by the reflection at both ends of a net in spite of the input of only 5 V control signal.

These nets which connect components which easily cause operation errors or damages due to the generation of noise on signals and which easily cause reflection are described in the noise reduction component circuit pattern information stored in the noise reduction component circuit pattern information storage unit 145. The noise reduction component recognition unit 121 reads circuit information from the circuit information storage unit 141, and checks it with the noise reduction component circuit pattern information, thereby recognizing a noise reduction component-to-be-added target net. The noise reduction component recognition unit 121 writes information on the identification number of the recognized noise reduction component-to-be-added target net, and candidates for the noise reduction component to be added to the net to the noise reduction component circuit information storage unit 147.

Then, the noise reduction component addition unit 122 refers to the noise reduction component circuit information and provides the noise reduction component-to-be-added target net with noise reduction components which have been selected in accordance with the predetermined priority order. The noise reduction component addition unit 122 provides the newly provided noise reduction components with identification numbers, the names of the components, and the priority order. The noise reduction component addition unit 122 further refers to the noise reduction component circuit pattern information, and writes information on, for example, the types of components and the rated values to the noise reduction component information storage unit 148 (step 1001). It is possible that the designer provides noise reduction component through interactive input when the process is started.

Here, the noise reduction component addition unit 122 has added to the net shown in FIG. 7(a) the resistance 201 having a temporarily resistance value of 51Ω, as noise reduction component. The noise reduction component may be added to all the nets having the uniform noise reduction component circuit pattern. The noise reduction component may be added only to the nets which may cause any problems by previously providing a certain rule and by circuit-simulating the nets which have uniform pattern. The circuit-simulation is a program for calculating circuit signals, based on only information on components information and their connections.

Then the design rule generation unit 133 forms a design rule, which will be detailed below (step 1002).

The layout unit 132 sets a layout, which includes the placement of components and routes, by using the modified circuit information and design rule. Then, the layout unit 132 writes the coordinate value which indicates the positions of routes on the board to the board design information storage unit 149 (step 1003). If the area for disposing all the components and connecting routes is not sufficient (step 1004), the layout unit 132 starts the noise reduction component deletion unit 123 to delete noise reduction components until the size of the components fits the area in accordance with priority order (step 1005). Then, a layout is set again (step 1003). When no more noise reduction component can be deleted (step 1006), and the area is not sufficient for all the components to be disposed and connected, then the display unit 108 displays the condition (step 1007) to terminate the process.

The evaluation unit 131 simulates the transmission lines in accordance with the width and length of routes to be laid out, and compares the outputted waveform with the evaluation rule stored in the evaluation information storage unit 146, thereby evaluating the laid out circuit. The transmission line simulation means to calculate signal waveforms on the transmission lines, based on a program, in accordance with component information such as the rise characteristics or fall characteristics of the electric waveform of pins, input/output impedance, and pin capacity or physical information such as the shape and length of routes, or the dielectric constant of the board (step 1008).

Here, the output waveform shown in FIG. 8(*c*) is obtained. The evaluation unit 131 evaluates that the resistance 201 having a temporarily resistance value of 51Ω, which is the noise reduction component added by the noise reduction component addition unit 122 is not acceptable. This evaluation is based on the fact that the overshoot at the point of P2 is still 7 V, which is above the evaluation rule value.

Based on the evaluation results of the evaluation unit 131(step 1009), the rated value modification unit 124 modifies the rated value of the noise reduction component corresponding to the evaluated position whose output waveform does not meet the evaluation rule (step 1010). In this case, the rated value modification unit 124 selects the next rated value from among the candidates of rated values to be modified, which are described in noise reduction component information. The rated value modification unit 124 selects the resistance value 75Ω, which is a candidate of the rated values to be modified, then modifies the resistance 201 having the temporary resistance value of 51Ω into the resistance 202 having a resistance value of 75Ω as shown in FIG. 7(*c*).

If the rated values, which can be modified, of all the noise reduction components on positions whose output waveforms do not meet the evaluation rule have been already modified to a determined value, any component which can change into another type is so changed. In this case, the rated value is modified again within the range of modifiable rated values from the temporary resistance value. Every time a changeable attribute such as the resistance value of the noise reduction component is modified, the rated value modification unit 124 rewrites the noise reduction component information stored in the noise reduction component information storage unit 148. The types of noise reduction components may be or may not be changed depending on the PC board to be designed.

Then, the evaluation unit 131 evaluates the position to be evaluated (step 1011), and if the output waveform of the position does not meet the evaluation rule (step 1012), the layout unit 132 changes the layout (step 1013). The evaluation unit 131 further evaluates another position (step 1014), and if the output waveform of the position does not meet the evaluation rule (step 1015), the noise reduction component deletion unit 123 adds the deleted noise reduction component again. The priority order of the re-added noise reduction component is changed as not being deletable, and the noise reduction component information stored in the noise reduction component information storage unit 148 is rewritten (step 1016). Then, the noise reduction component deletion unit 123 deletes deletable components until the area for all the components to be disposed and connected is ensured (step 1005). If the area cannot be ensured (step 1006), the noise reduction component deletion unit 123 makes the display unit 108 to display the condition (step 1007), and terminates the process. The board design system continues the above operations until the output waveform of the position to be evaluated meets the evaluation rule.

When the output waveforms of all the positions to be evaluated meet the evaluation rule, the rated value modification unit 124 refers to the noise reduction component information stored in the noise reduction component information storage unit 148. The rated value modification unit 124 then judges whether the rated value of the noise reduction component which has been eventually determined is within the range ineffective to the electric characteristics of the designed PC board even if the noise reduction component has been deleted. If it has been judged to be deletable, it is deleted. At this moment, the rated value modification unit 124 starts the evaluation unit 131 to evaluate the output waveform of the position to be evaluated. If the waveform does not meet the evaluation rule, the deleted noise reduction component can be re-added. This step can be skipped depending on the board to be designed.

When the results of the evaluation eventually meet the evaluation rule, the rated value evaluation unit 124 writes the final component information for the noise reduction component written in the noise reduction component information storage unit 148 to the circuit modification information storage unit 150, and also outputs to the circuit modification information output unit 172.

The design rule generation unit 133 forms the design rule for each board, based on the simulation results, as follows.

Figure 10:
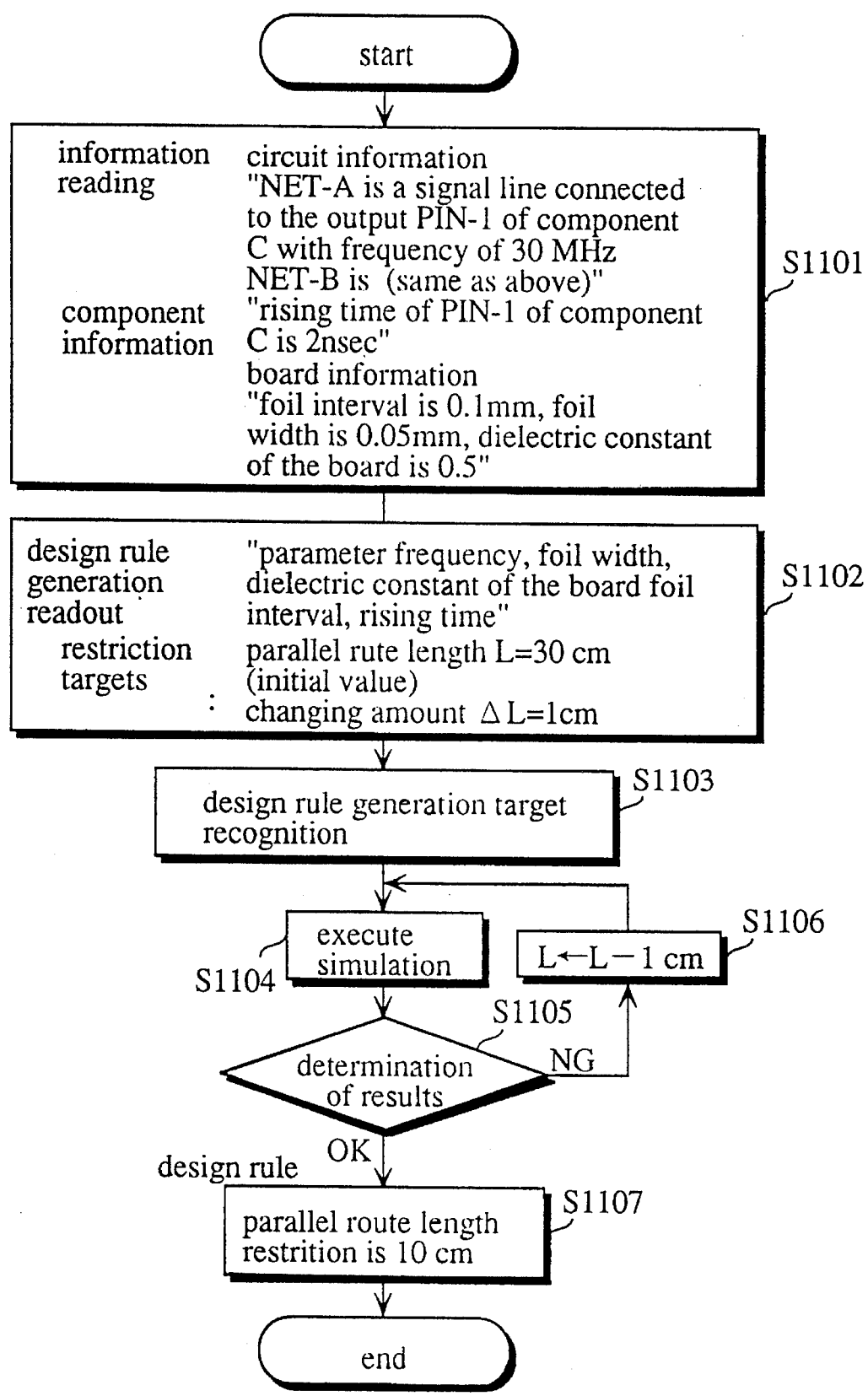
FIG. 10 is a flowchart depicting a procedure of generating a design rule by the design rule generation unit 133.

FIG. 10 is a flowchart depicting the procedure of generating a design rule by the design rule generation unit 133.

The design rule generation unit 133 forms a design rule including the restriction on the length of parallel routes, length of routes, and designation of equal length routes in order to avoid signal delay and to reduce noises and electromagnetic radiation, based on the circuit information and board information. To be more specific, the design rule generation unit 133 forms the design rule, for example route length, corresponding to the target for which the design rule is formed, described in the design rule formation information, based on the circuit information, component information, and board information.

The design rule generation unit 133 reads out circuit information, component information, and board information respectively from the circuit information storage unit 141, the component information storage unit 142, and board information storage unit 143 (step 1101). Then, these three types of information are compared with design rule generation information read out of the design rule storage unit 144 (step 1102), thereby recognizing the target for which the design rule is formed (step 1103).

The design rule generation information shown in FIG. 12 includes a description that "a parallel length between a signal line to transmit a high frequency signal and a route disposed parallel to the signal line is made a design rule generation target, and parameters for the parallel length are composed of (1) the frequency of signals to be transmitted, (2) routing interval, (3) dielectric constant of the board, (4) the width of routing foils, (5) the rising time in output pin". The design rule generation unit 133 reads out "frequency of 30 MHz of NET-A connected to the output pin PIN-A of the component C, which is a block and routing foil interval of 0.1 mm, the dielectric constance of the board: 0.5, the width of the routing foils:0.05 mm, the rising time in an output pin: 2 nsec" from the circuit information, component information, and board information. The reading is based on the information which indicates a target: "parallel route length L" in the design rule generation information, and information which indicates a parameter: "frequency of a signal to be transmitted, routing interval, dielectric constant of the board, width of routing foils, rising time in an output pin". The design rule generation unit 133 may generate a design rule as a parallel route length restriction which is separately determined for NET-A and NET-B by recognizing NET-A and NET-B which correspond to "frequency of 30 MHz, routing interval of 0.1 mm, dielectric constant of 0.5 of the board, routing foil width of 0.05 mm, rising time of 2 nsec in an output pin".

In the design rule generation information, "parallel route length L=30 cm when the rising time 2 nsec in an output pin" and the changing amount of the target "ΔL=1 cm" are predetermined as the initial values for the target. The design rule generation unit 133 starts the evaluation unit 131 and gives the target "L", the initial value "L=30 cm", and the changing amount "ΔL=1 cm" to the evaluation unit 131. As a result, the evaluation unit 131 executes some simulations such as a transmission line simulation or a cross talk simulation under the parameter value "frequency of 30 MHz and routing interval of 0.1 mm, dielectric constant of 0.5 of the board, routing foil width of 0.05 mm and rising time 2 nsec in an output pin" (step 1104). To be more specific, the evaluation unit 131 assumes a routing pattern to be laid out with the restrictions of routing foil width of 0.05 mm, routing foil interval of 0.1 mm, and parallel route length L on the board having dielectric constant of 0.5. When a signal having 30 MHz frequency and 2 nsec rising time is inputted to one of them, the evaluation unit 131 calculates effects caused by noise, such as cross talk appearing on the other.

The design rule generation unit 133 judges whether the bad influence such as cross talks to be caused between the parallel routes as a result of the simulation is within a negligible range or not, from the view point of the electric characteristics of the designed PC board. The judgement is done by seeing whether the output waveform of the position to be evaluated satisfies a predetermined evaluation rule.

When the output form does not satisfy the evaluation rule, that is, when the bad influence such as cross talk is negligible (step 1105), the route length is further restricted by, for example, shortening the parallel route length L by 1 cm, that is, the parameter L is changed by the parameter changing amount (−ΔL) (step 1106). Then, a simulation is performed again (step 1104). The design rule generation unit 133 continues the steps 1104–1106 until the output waveform satisfies the evaluation rule. The parameter amount when the waveform satisfies the evaluation rule is made the design rule (step 1107). Then, the design rule generation unit 133 returns to the step 1101 in order to determine the next generation rule.

The design rule generation unit 133 generates the design rule "the length of route disposed parallel to nets: NET-A and NET-B is made 10 cm or shorter".

The design rule generation unit 133 writes the generated design rule to the design rule storage unit 144. Responding to an output request inputted through the interactive input unit 104, the design rule generation unit 133 makes the display unit 108 display the generated design rule and makes the print unit 109 print, thereby outputting it through the design rule storage unit 144 to another system such as CAD or CAM.

Thus, design rule suitable to the electric characteristics of the PC board to be designed can be produced.

Figure 11:
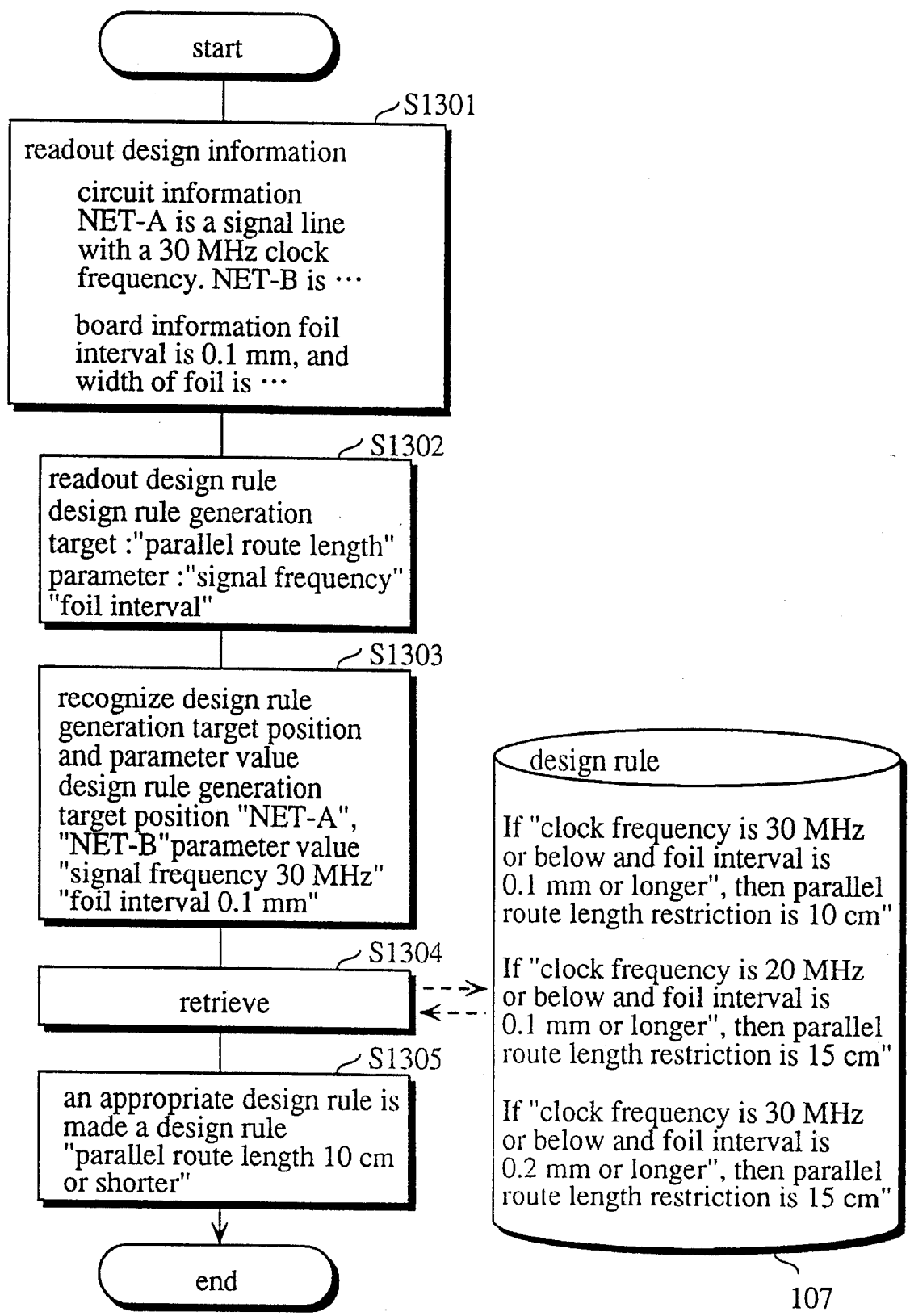
FIG. 11 is a flowchart depicting another procedure of generating design rule in the design rule generation unit 133.

FIG. 11 is a flowchart depicting the procedure of generating design rule in the design rule generation unit 133, with reference to the database for generating design rules stored in the external storage unit 107.

The design rule generation unit 133 reads out circuit information, component information, and board information respectively from the circuit information storage unit 141, component information storage unit 142, and board information storage unit 143 (step 1301), and reads out design rule generation information stored in the design rule storage unit 144 (step 1302).

The design rule generation unit 133 recognizes parameters which are determined per target in the design rule generation information, parameter values, and positions for which design rules are formed. In this case, the design rule generation unit 133 recognizes NET-A and NET-B as positions for which design rules to be formed, and further recognizes 30 MHz of the clock frequency of NET-A and NET-B and their interval 0.1 mm as a parameter and parameter value (step 1303).

The design rule generation unit 133 retrieves the database for generating design rules and looks for a design rule according to which the parameter value satisfies a requirement.

The design rule describes restriction values to be determined as design rule for each target for which design rule is generated, depending on the parameter value.

One example of such design rule is that "if the clock frequency is 30 MHz or below and the routing interval is 0.1 mm or longer, the length of parallel routes is made 10 cm or shorter". Another example is that "if the clock frequency is 20 MHz or below and the routing interval is 0.1 mm or longer, the length of parallel routes is made 15 cm or shorter".

Thus, design rules describe restriction values to be determined as design rule for each target when the parameter satisfies a requirement which includes a range of a parameter value (step 1304).

The design rule generation unit 133 retrieves the database for generating design rules to look for a design rule according to which the parameter value "30 MHz clock frequency and 0.1 mm routing interval" satisfies the requirement. Here, the design rule generation unit 133 has a design rule that "if the clock frequency is 30 MHz or below and the routing interval is 0.1 mm or longer, the length of parallel routes is made 10 cm or shorter". The design rule generation unit 133 determines the restriction value of the design rule obtained from the retrieval, as design rule for the target position. As a result, the design rule generation unit 133 generates the design rule "the length of parallel routes is made 10 cm or shorter" for NET-A and NET-B (step 1305).

The design rule generation unit 133 continues the steps 1301–1305, thereby generating a design rule for all the positions for which design rules are formed.

Thus, design rule suitable to the electric characteristics of the PC board to be designed can be produced.

Although the design rule generation information is stored in the design rule storage unit 144 in the present PC board design system, it may be stored in the database for generating design rules.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A system for designing a circuit board, based on circuit board information, noise reduction information, and evaluation information, said circuit board information indicating a board to be used for a circuit board to be designed, a circuit to be laid out on the board, and components to be included in the circuit, said noise reduction information indicating anti-noise solution, said evaluation information indicating electric characteristics of the circuit board in process of designing, said system comprising:

an input means for receiving said circuit board information, said noise reduction information, and said evaluation information;

noise reduction component addition means for adding noise reduction components to the circuit described in said circuit board information, based on information on noise reduction components described in the received noise reduction information, and for modifying the circuit board information in accordance with the noise reduction components-added circuit;

a layout means for (1) laying out components and routes on the board described by said circuit board information, based on the circuit board information which has been modified by said noise reduction component addition means, and another information on restrictions to the layout described in said noise reduction information, for (2) generating layout information, using locations of the components and the routes laid out on the board as coordinate values, and for (3) further modifying the circuit board information modified by said noise reduction component addition means in accordance with the laid out circuit;

an evaluation means for evaluating electric characteristics of evaluation targets in the circuit described by said layout information and the circuit board information at that moment, based on said evaluation information on the electric characteristics of the circuit board in the process of designing;

rated value modification means for replacing the noise reduction components with other noise reduction components having different rated values, based on information on noise reduction components in said noise reduction information, and for modifying said circuit board information in accordance with the circuit having changed rated values;

a control means for starting said evaluation means every time said layout means completes a layout, and for starting said evaluation means every time said rated value modification means changes a rated value of a noise reduction component in the circuit;

an output means for outputting said circuit board information and said layout information when the electric characteristics of predetermined evaluation targets among the evaluation targets in the circuit described in said circuit board information and said layout information have been fairly evaluated by said evaluation means.

2. The system of claim 1, wherein said noise reduction component addition means comprises:

a noise reduction component-added-position recognition unit for recognizing a position which is supposed to be added a noise reduction component by comparing information indicating a position on the circuit to be added a noise reduction component, said information belonging to said noise reduction information with the inputted circuit board information; a noise reduction component recognition unit for recognizing a noise reduction component which has been already added to a position recognized by said noise reduction component-added-position recognition unit;

a noise reduction component addition unit for adding a noise reduction component to the recognized position that has not been added a noise reduction component yet, based on information indicating a noise reduction component to be added and another information indicating a rated value of the noise reduction component to be added;

a priority assigning unit for assigning priorities to the noise reduction components recognized by said noise reduction component recognition unit and a noise reduction component newly added by said noise reduction component addition unit; and a first circuit board information-modification unit for adding said information indicating the priorities to said information describing the noise reduction components in the circuit board information, and for, when said noise reduction component addition unit has newly added a noise reduction component, modifying the inputted circuit board information in accordance with the circuit having the newly added noise reduction component; and wherein said layout means comprises:

a layout area recognition unit for recognizing an area on the board which is described in the circuit board information and which can lay out components included in the circuit described in said circuit board information modified by said first circuit board information modification unit and routes to connect the components;

a layout unit for laying out the components included in the circuit described in said circuit board information and the routes to connect the components, in accordance with a restriction to the layout described in said noise reduction information, the components and the routes being laid out on the area recognized by said layout area recognition unit;

a layout judging unit for judging whether or not the layout of all necessary components and routes can be completed;

a noise reduction component deletion unit for sequentially deleting deletable noise reduction components in the circuit described in the circuit board information modified by said first circuit board information modification unit, starting at a noise reduction component which has been assigned a lowest priority, when the layout has been judged not to be able to be completed;

a layout information generation unit for generating layout information, using as coordinate values locations of the components and the routes laid out on the board by said layout unit;

a second circuit board information modification unit for further modifying the circuit board information modified by said first circuit board information modification unit by adding information indicating deleted noise reduction components to the information describing noise reduction components included in the circuit of said circuit board information;

a layout control unit for starting said layout area recognition unit, said layout unit, and said layout judging unit every time said noise reduction component deletion unit deletes a noise reduction component.

3. The system of claim 2, wherein said rated value modification means further comprises:

a rated value modification unit for replacing the noise reduction components added to the evaluation targets whose electric characteristics have been poorly evaluated by said evaluation means, with other noise reduction components having different rated values, based on information described in said noise reduction information: (1) information indicating noise reduction components which can be replaced by other noise reduction components having different rated values, (2) information indicating a range of the different rated values; and a third circuit board information modification unit for modifying said circuit board information modified by said second circuit board information modification unit in accordance with the circuit including a noise reduction component having a modified rated value.

4. The system of claim 3 further comprising:

a layout modification control unit for starting said layout means to lay out again the circuit described in said circuit board information at that point onto a location different from a location described in said layout information, when electric characteristics of a predetermined evaluation target have not been fairly evaluated by said evaluation means, even after all modifiable rated values of noise reduction components are modified;

a deleted noise reduction component re-addition unit for re-adding the deleted noise reduction components to evaluation targets whose electric characteristics have been poorly evaluated, the addition starting at a noise reduction component assigned a highest priority;

priority order change unit for changing an order of priorities assigned to the re-added noise reduction components into a different order indicating impossibility of deleting the noise reduction components;

a fourth circuit board information modification unit for (1) changing information added by said second circuit board information modification unit, said information indicating that a noise reduction component has been deleted, into information indicating the deleted noise reduction component has been re-added, and for (2) changing a priority order in the information describing noise reduction components into the priority order changed by said priority order change unit; and deleted noise reduction component re-addition control unit for (1) putting said rated value modification unit stand-by after a completion of a layout by said layout means based on a direction of said layout modification control unit, and an evaluation performed by said evaluation means subsequent to the layout, for (2) starting said layout means every time said deleted noise reduction component re-addition control means re-adds a deleted noise reduction component to the circuit, and for (3) starting said rated value modification unit if said evaluation means does not fairly evaluate the electric characteristics of a predetermined evaluation target in the circuit to which all noise reduction components that can be re-added have been re-added.

5. The system of claim 4, wherein said noise reduction component addition means further comprises a first circuit evaluation unit for circuit-simulating a part including the recognized noise reduction component-to-be-added position in a circuit, said part being a circuit evaluation target described in said evaluation information, thereby determining whether an output of the circuit simulation for the circuit evaluation target satisfies a circuit evaluation rule described in said evaluation information, and for, when the circuit evaluation target does not satisfy the circuit evaluation rule, making said noise reduction component addition unit add a predetermined noise reduction component to the recognized noise reduction component-to-be-added position, based on the information indicating noise reduction components to be added, and the information indicating a rated value of the noise reduction component to be added.

6. The system of claim 5, wherein said noise reduction component addition means further comprises:

a second circuit evaluation unit for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modification unit for replacing all noise reduction components having changeable rated values with other noise reduction components having different rated values when said second circuit evaluation unit poorly evaluated the electric characteristics of the part of the circuit; and a noise reduction component rated value modification control unit for making said circuit evaluation unit evaluate the electric characteristics of the part including the noise reduction components having the different rated values, every time a noise reduction component is replaced with another noise reduction component having a different rated value.

7. The system of claim 6, wherein said rated value modification means further comprises:

a garbage noise reduction component recognition unit for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and a garbage noise reduction component deletion unit for deleting noise reduction components recognized by said garbage noise reduction component recognition unit and for modifying said circuit board information in accordance with the circuit from which the noise reduction components have been deleted as garbage noise reduction components, and for starting said layout means.

8. The system of claim 7 further comprising:

a design rule generation information input unit for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;

design rule generation unit for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and design rule output unit for, when the result of the simulation does not satisfy the predetermined design rule generation evaluation standard even if the value of the design rule is changed to every possible value within the range, outputting a situation, and for outputting the generated design rule and for directing said layout means to set a layout based on the generated design rule, when the result of the simulation satisfies the predetermined design rule generation evaluation standard.

9. The system of claim 8, wherein said evaluation means comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said evaluation means including a transmission line simulation carried out by said transmission line simulator.

10. The system of claim 9, wherein said design rule generation unit comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generation unit including a transmission line simulation carried out by said transmission line simulator.

11. The system of claim 7 further comprising:
   a design rule generation information input unit for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;
   a design rule storage unit for storing a design rule corresponding to a predetermined value of said parameter for every predetermined design rule generation target;
   a design rule generation unit for reading from said design rule storage unit a design rule to be determined by said parameter, based on the inputted design rule generation information, thereby making the read design rule into a design rule for said design rule generation target; and
   a design rule output unit for outputting the generated design rule and for directing said layout means to set a layout based on the generated design rule.

12. The system of claim 8, wherein said evaluation means further comprises:
   an evaluation rule storage unit for storing types of noise reduction components added in the circuit including said evaluation targets and a range of rated values of the added noise reduction components, for every predetermined evaluation target;
   evaluation target recognition unit for recognizing an evaluation target in the circuit described by said layout information and said circuit board information at that point, based on information described in said evaluation information indicating an evaluation target in the laid out circuit; and
   an evaluation unit for evaluating the electric characteristics of said evaluation targets by determining whether or not the types and rated values of the noise reduction components satisfy the evaluation rule stored in said evaluation storage unit.

13. The system of claim 4, wherein said noise reduction component addition means further comprises:
   a second circuit evaluation unit for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;
   a noise reduction component rated value modification unit for replacing all noise reduction components having changeable rated values with other noise reduction components having different rated values when said second circuit evaluation unit poorly evaluated the electric characteristics of the part of the circuit; and
   a noise reduction component rated value modification control unit for making said circuit evaluation unit evaluate the electric characteristics of the part including the noise reduction components having the different rated values, every time a noise reduction component is replaced with another noise reduction component having a different rated value.

14. The system of claim 4 further comprising:
   a design rule generation information input unit for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;
   design rule generation unit for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and
   design rule output unit for, when the result of the simulation does not satisfy the predetermined design rule generation evaluation standard even if the value of the design rule is changed to every possible value within the range, outputting a situation, and for outputting the generated design rule and for directing said layout means to set a layout based on the generated design rule, when the result of the simulation satisfies the predetermined design rule generation evaluation standard.

15. The system of claim 14, wherein wherein said design rule generation unit comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generation unit including a transmission line simulation carried out by said transmission line simulator.

16. The system of claim 4 further comprising:
a design rule generation information input unit for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;
a design rule storage unit for storing a design rule corresponding to a predetermined value of said parameter for every predetermined design rule generation target;
a design rule generation unit for reading from said design rule storage unit a design rule to be determined by said parameter, based on the inputted design rule generation information, thereby making the read design rule into a design rule for said design rule generation target; and
a design rule output unit for outputting the generated design rule and for directing said layout means to set a layout based on the generated design rule.

17. The system of claim 4, wherein said rated value modification means further comprises:
a garbage noise reduction component recognition unit for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and
a garbage noise reduction component deletion unit for deleting noise reduction components recognized by said garbage noise reduction component recognition unit and for modifying said circuit board information in accordance with the circuit from which the noise reduction components have been deleted as garbage noise reduction components, and for starting said layout means.

18. The system of claim 2, wherein said noise reduction component addition means further comprises a first circuit evaluation unit for circuit-simulating a part including the recognized noise reduction component-to-be-added position in a circuit, said part being a circuit evaluation target described in said evaluation information, thereby determining whether an output of the circuit simulation for the circuit evaluation target satisfies a circuit evaluation rule described in said evaluation information, and for, when the circuit evaluation target does not satisfy the circuit evaluation rule, making said noise reduction component addition unit add a predetermined noise reduction component to the recognized noise reduction component-to-be-added position, based on the information indicating noise reduction components to be added, and the information indicating a rated value of the noise reduction component to be added.

19. The system of claim 2, wherein said noise reduction component addition means further comprises:
a second circuit evaluation unit for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;
a noise reduction component rated value modification unit for replacing all noise reduction components having changeable rated values with other noise reduction components having different rated values when said second circuit evaluation unit poorly evaluated the electric characteristics of the part of the circuit; and
a noise reduction component rated value modification control unit for making said circuit evaluation unit evaluate the electric characteristics of the part including the noise reduction components having the different rated values, every time a noise reduction component is replaced with another noise reduction component having a different rated value.

20. The system of claim 2, wherein said rated value modification means further comprises:
a garbage noise reduction component recognition unit for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and
a garbage noise reduction component deletion unit for deleting noise reduction components recognized by said garbage noise reduction component recognition unit and for modifying said circuit board information in accordance with the circuit from which the noise reduction components have been deleted as garbage noise reduction components, and for starting said layout means.

21. The system of claim 1 further comprising:
a design rule generation information input unit for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;
design rule generation unit for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and design rule output unit for, when the result of the simulation does not satisfy the predetermined design rule generation evaluation standard even if the value of the design rule is changed to every possible value within the range, outputting a situation, and for outputting the generated design rule and for directing said layout means to set a layout based on the generated design rule, when the result of the simulation satisfies the predetermined design rule generation evaluation standard.

22. The system of claim 21, wherein said design rule generation unit comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generation unit including a transmission line simulation carried out by said transmission line simulator.

23. The system of claim 1 further comprising:

a design rule generation information input unit for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;

a design rule storage unit for storing a design rule corresponding to a predetermined value of said parameter for every predetermined design rule generation target;

a design rule generation unit for reading from said design rule storage unit a design rule to be determined by said parameter, based on the inputted design rule generation information, thereby making the read design rule into a design rule for said design rule generation target; and a design rule output unit for outputting the generated design rule and for directing said layout means to set a layout based on the generated design rule.

24. The system of claim 1, wherein said rated value modification means further comprises:

a garbage noise reduction component recognition unit for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and a garbage noise reduction component deletion unit for deleting noise reduction components recognized by said garbage noise reduction component recognition unit and for modifying said circuit board information in accordance with the circuit from which the noise reduction components have been deleted as garbage noise reduction components, and for starting said layout means.

25. A method for designing a circuit board, based on circuit board information, noise reduction information, and evaluation information, said circuit board information indicating a board to be used for a circuit board to be designed, a circuit to be laid out on the board, and components to be included in the circuit, said noise reduction information indicating anti-noise solution, said evaluation information indicating electric characteristics of the circuit board in process of designing, said method comprising:

a receiving step for receiving said circuit board information, said noise reduction information, and said evaluation information;

a noise reduction component adding step for adding noise reduction components to the circuit described in said circuit load information, based of information on noise reduction components described in the received noise reduction information, and modifying the circuit board information in accordance with the noise reduction components-added circuit;

a layout step for laying out components and routes on the board described by said circuit board information, based on the circuit board information which has been modified, and another information on restrictions to the layout described in said noise reduction information, generating layout information, using locations of the components and the routes laid out on the board as coordinate values, and further modifying the circuit board information modified in said noise reduction component adding step in accordance with the laid out circuit;

an evaluating step for evaluating electric characteristics of evaluation targets in the circuit described by said layout information and the circuit board information at that moment, based on said evaluation information on the electric characteristics of the circuit board in the process of designing;

a rated value modifying step for replacing the noise reduction components with other noise reduction components having different rated values, based on information on noise reduction components in said noise reduction information, and for modifying said circuit board information in accordance with the circuit having changed rated values; and an output step for outputting said circuit board information and said layout information when the electric characteristics of predetermined evaluation targets among the evaluation targets in the circuit described in said circuit board information and said layout information have been fairly evaluated.

26. The method of claim 25, wherein said noise reduction component adding step comprises:

a noise reduction component added-position recognizing sub step for recognizing a position which is supposed to be added a noise reduction component by comparing information indicating a position on the circuit to be added a noise reduction component, said information belonging to said noise reduction information with the inputted circuit board information, a noise reduction component recognizing sub step for recognizing a noise reduction component which has been already added to a position recognized in said noise reduction component-added-position recognizing sub step;

a noise reduction component adding sub step for adding a noise reduction component to the recognized position that has not been added a noise reduction component yet, based on information indicating a noise reduction component to be added and another information indicating a rated value of the noise reduction component to be added;

an assigning sub step for assigning priorities to the noise reduction components recognized in said noise reduction component recognizing sub step and a noise reduction component newly added in said noise reduction component adding sub step; and a first circuit board information modifying sub step for first adding said information indicating the priorities to said information describing the noise reduction components in the circuit board information, and when said noise reduction component adding sub step has newly added a noise reduction component, modifying the inputted circuit board information in accordance with the circuit having the newly added noise reduction component; and wherein said layout step comprises:

a layout area recognizing sub step for recognizing an area on the board which is described in the circuit board information and which can lay out components included in the circuit described in said circuit board information modified in said first circuit board information modifying sub step and routes to connect the components;

a layout sub step for laying out the components included in the circuit described in said circuit board information and the routes to connect the components, in accordance with a restriction to the layout described in said noise reduction information, the components and the routes being laid out on the area recognized in said layout area recognizing sub step;

a layout judging sub step for judging whether or not the layout of all necessary components and routes can be completed;

a noise reduction component deletion sub step for sequentially deleting deletable noise reduction components in the circuit described in the circuit board information modified in said first circuit board information modifying sub step, starting at a noise reduction component which has been assigned a lowest priority, when the layout has been judged not to be able to be completed; for executing operations of said layout sub step every time a noise reduction component is deleted, continuing the deleting operation until a layout has been judged to be able to be completed in said layout judging sub step, and for, when the completion of a layout has been judged to be impossible even after all the deletable noise reduction components are deleted, outputting the situation;

a layout information generating sub step for generating layout information, using as coordinate values locations of the components and the routes laid out on the board in said layout sub step; and a second circuit board information modifying sub step for further modifying the circuit board information modified in said first circuit board information modifying sub step by adding information indicating deleted noise reduction components to the information describing noise reduction components included in the circuit of said circuit board information, every time a noise reduction component is deleted in said noise reduction component deletion sub step.

27. The method of claim 26, wherein said rated value modifying step further comprises:

a rated value modifying sub step for repeating an evaluating operation in said evaluating step every time a noise reduction component added to the evaluation target whose electric characteristics have been poorly evaluated in said evaluating step is replaced with other noise reduction components having different rated values, based on information described in said noise reduction information: (1) information indicating noise reduction components which can be replaced by other noise reduction components having different rated values, (2) information indicating a range of the different rated values, and continuing the replacement until the electric characteristics of the evaluation target is fairly evaluated in said evaluating step; and a third circuit board information modifying sub step for modifying said circuit board information modified in said second circuit board information modifying step in accordance with the circuit including a noise reduction component having a modified rated value;

a layout modifying sub step for starting said layout step to lay out again the circuit described in said circuit board information at that point onto a location different from a location described in said layout information, when electric characteristics of a predetermined evaluation target have not been fairly evaluated in said evaluating step, even after all modifiable rated values of noise reduction components are modified;

a deleted noise reduction component re-adding step for making said evaluating step evaluate all evaluation targets included in the circuit which has been laid out again in said layout step, for re-adding the deleted noise reduction components to evaluation targets whose electric characteristics have been poorly evaluated, starting at a noise reduction component assigned a highest priority, executing said layout step to lay out re-added noise reduction components every time a noise reduction component is re-added and evaluating the laid out circuit, thus continuing the re-adding operation until the electric characteristics of the predetermined evaluation targets are fairly evaluated;

priority order changing unit for changing an order of priorities assigned to the re-added noise reduction components into a different order indicating impossibility of deleting the noise reduction components, every time a noise reduction component is re-added;

a fourth circuit board information modifying step for (1) changing information added in said second circuit board information modifying substep, said information indicating that a noise reduction component has been deleted, into information indicating the deleted noise reduction component has been re-added, said information being in said circuit board information modified in said second circuit board information modifying sub step, every time a noise reduction component is re-added; and wherein when the electric characteristics of all the evaluation targets in the circuit to which the once deleted noise reduction components have been re-added are not fairly evaluated, sub steps from said rate value modifying sub step to said fourth circuit board information modifying step are repeated until the electric characteristics of the predetermined valuation targets are fairly evaluated.

28. The method of claim 27, wherein said noise reduction component adding step further comprises a first circuit evaluating sub step for circuit-simulating a part including the recognized noise reduction component-to-be-added position in a circuit, thereby determining whether an output of the circuit simulation for the circuit evaluation target satisfies a predetermined circuit evaluation rule, and for, when the circuit evaluation target does not satisfy the circuit evaluation rule, adding a predetermined noise reduction component to the noise reduction component-to-be-added position recognized in said noise reduction component recognizing sub step, based on the information indicating noise reduction components to be added, and the information indicating a rated value of the noise reduction component to be added.

29. The method of claim 28, wherein said noise reduction component adding step further comprises:

a second circuit evaluation sub step for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modifying sub step for replacing all noise reduction components having changeable rated values with other noise reduction components having different rated values when the electric characteristics of the part of the circuit have been poorly evaluated in said second circuit evaluating step, for circuit simulating a part including a noise reduction component replaced by another noise reduction component having a different rated value, for continuing the changing operation of rated values and the evaluating operation in said second circuit evaluating sub step until the electric characteristics of all the evaluation targets are fairly evaluated in said circuit evaluating sub step.

30. The method of claim 29, wherein said rated value modifying step further comprises:

a garbage noise reduction component recognizing sub step for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and a garbage noise reduction component deleting sub step for deleting noise reduction components recognized by said garbage noise reduction component recognizing sub step, and for modifying said circuit board information in accordance with the circuit from which the noise reduction components have been deleted as garbage noise reduction components.

31. The method of claim 30 further comprising:

a design rule generation information input sub step for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;

a design rule generating sub step for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and a design rule output sub step for, when the result of the simulation does not satisfy the predetermined design rule generation evaluation standard even if the value of the design rule is changed to every possible value within the range, outputting the situation, and for outputting the generated design rule and for directing said layout step to set a layout based on the generated design rule, when the result of the simulation satisfies the predetermined design rule generation evaluation standard.

32. The method of claim 31, wherein said evaluating step comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said evaluating step being a transmission line simulation carried out by said transmission line simulator.

33. The method of claim 32, wherein said design rule generating sub step comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generating step being a transmission line simulation carried out by said transmission line simulator.

34. The method of claim 30 further comprising:

a design rule generation information input sub step for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;

a design rule generating sub step for storing a design rule corresponding to a predetermined value of said parameter for every predetermined design rule generation target to memory, and for reading from said memory, based on the inputted design rule generation information, thereby making the read design rule into a design rule for said design rule generation target; and a design rule output sub step for outputting the generated design rule and for directing said layout step to set a layout based on the generated design rule.

35. The method of claim 31, wherein said evaluation step further comprises:

evaluation target recognizing step for storing types of noise reduction components added in the circuit including said evaluation targets and a range of rated values of the added noise reduction components to memory for every predetermined evaluation target and for recognizing an evaluation target in the circuit described by said layout information and said circuit board information at that point, based on information described in said evaluation information indicating an evaluation target in the laid out circuit; and an evaluating sub step for evaluating the electric characteristics of said evaluation targets by determining whether or not the types and rated values of the noise reduction components satisfy the evaluation rule stored in the memory.

36. The method of claim 27, wherein said noise reduction component adding step further comprises:

a second circuit evaluation sub step for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modifying sub step for replacing all noise reduction components having changeable rated values with other noise reduction components having different rated values when the electric characteristics of the part of the circuit have been poorly evaluated in said second circuit evaluating step, for circuit simulating a part including a noise reduction component replaced by another noise reduction component having a different rated value, for continuing the changing operation of rated values and the evaluating operation in said second circuit evaluating sub step until the electric characteristics of all the evaluation targets are fairly evaluated in said circuit evaluating sub step.

37. The method of claim 27 further comprising:

a design rule generation information input sub step for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;

a design rule generating sub step for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and a design rule output sub step for, when the result of the simulation does not satisfy the predetermined design rule generation evaluation standard even if the value of the design rule is changed to every possible value within the range, outputting the situation, and for outputting the generated design rule and for directing said layout step to set a layout based on the generated design rule, when the result of the simulation satisfies the predetermined design rule generation evaluation standard.

38. The method of claim 37, wherein said design rule generating sub step comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generating step being a transmission line simulation carried out by said transmission line simulator.

39. The method of claim 27 further comprising:

a design rule generation information input sub step for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;

a design rule generating sub step for storing a design rule corresponding to a predetermined value of said parameter for every predetermined design rule generation target to memory, and for reading from said memory, based on the inputted design rule generation information, thereby making the read design rule into a design rule for said design rule generation target; and a design rule output sub step for outputting the generated design rule and for directing said layout step to set a layout based on the generated design rule.

40. The method of claim 27, wherein said rated value modifying step further comprises:

a garbage noise reduction component recognizing sub step for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and a garbage noise reduction component deleting sub step for deleting noise reduction components recognized by said garbage noise reduction component recognizing sub step, and for modifying said circuit board information in accordance with the circuit from which the noise reduction components have been deleted as garbage noise reduction components.

41. The method of claim 26, wherein said noise reduction component adding step further comprises a first circuit evaluating sub step for circuit-simulating a part including the recognized noise reduction component-to-be-added position in a circuit, thereby determining whether an output of the circuit simulation for the circuit evaluation target satisfies a predetermined circuit evaluation rule, and for, when the circuit evaluation target does not satisfy the circuit evaluation rule, adding a predetermined noise reduction component to the noise reduction component-to-be-added position recognized in said noise reduction component recognizing sub step, based on the information indicating noise reduction components to be added, and the information indicating a rated value of the noise reduction component to be added.

42. The method of claim 26, wherein said noise reduction component adding step further comprises:

a second circuit evaluation sub step for circuit-simulating the part in the circuit to which the noise reduction component has been added, in order to determine whether an output of the circuit simulation for a predetermined circuit evaluation target satisfies a predetermined circuit evaluation rule, thereby evaluating the electric characteristics of the part;

a noise reduction component rated value modifying sub step for replacing all noise reduction components having changeable rated values with other noise reduction components having different rated values when the electric characteristics of the part of the circuit have been poorly evaluated in said second circuit evaluating step, for circuit simulating a part including a noise reduction component replaced by another noise reduction component having a different rated value, for continuing the changing operation of rated values and the evaluating operation in said second circuit evaluating sub step until the electric characteristics of all the evaluation targets are fairly evaluated in said circuit evaluating sub step.

43. The method of claim 26 further comprising:

a design rule generation information input sub step for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;

a design rule generating sub step for storing a design rule corresponding to a predetermined value of said parameter for every predetermined design rule generation target to memory, and for reading from said memory, based on the inputted design rule generation information, thereby making the read design rule into a design rule for said design rule generation target; and a design rule output sub step for outputting the generated design rule and for directing said layout step to set a layout based on the generated design rule.

44. The method of claim 25 further comprising:

a design rule generation information input sub step for receiving design rule generation information which indicates targets for which to generate design rules and also indicates a parameter for determining an allowable range of values for the targets such as a length of parallel routes, said design rules being restrictions in laying out a circuit on the board, described in inputted circuit board information;

a design rule generating sub step for simulating a design rule generation target predetermined in accordance with said design rule generation information every time a possible value of the design rule generation target is changed by every predetermined value under said parameter, continuing the changing operation of the values of the design rule generation target and the evaluation through simulation until a result of a simulation satisfies the predetermined design rule generation evaluation standard, and for generating a design rule, using a reference value when the result satisfies the predetermined design rule generation evaluation standard as an allowable value for the design rule generation target; and a design rule output sub step for, when the result of the simulation does not satisfy the predetermined design rule generation evaluation standard even if the value of the design rule is changed to every possible value within the range, outputting the situation, and for outputting the generated design rule and for directing said layout step to set a layout based on the generated design rule, when the result of the simulation satisfies the predetermined design rule generation evaluation standard.

45. The method of claim 44, wherein said design rule generating sub step comprises a transmission line simulator for obtaining by calculations an output waveform when a predetermined input waveform is given to a net which connects terminals of each component in the circuit, based on location of components in a circuit actually laid out in a board, length of routes, conditions of connections among layers, physical shapes of foils, and dielectric constant of the board, a simulation carried out by said design rule generating step being a transmission line simulation carried out by said transmission line simulator.

46. The method of claim 25 further comprising:

a design rule generation information input sub step for receiving design rule generation information, which is used for generating a design rule indicating layout restrictions to be observed in laying out a circuit on the board described in inputted circuit board information, said design rule generation information indicating targets for which to generate design rules and parameter for determining a range of possible values of the targets, such as a length of parallel routes;

a design rule generating sub step for storing a design rule corresponding to a predetermined value of said parameter for every predetermined design rule generation target to memory, and for reading from said memory, based on the inputted design rule generation information, thereby making the read design rule into a design rule for said design rule generation target; and a design rule output sub step for outputting the generated design rule and for directing said layout step to set a layout based on the generated design rule.

47. The method of claim 25, wherein said rated value modifying step further comprises:

a garbage noise reduction component recognizing sub step for detecting a rated value of a noise reduction component added to an evaluation target whose electric characteristics have been fairly evaluated, by replacing a noise reduction component having a changeable rated value with another noise reduction component having a different rated value, for comparing the detected rated value with information indicating a range of the rated value when the replaced noise reduction component becomes useless as a result of the replacement, said information being described in the inputted noise reduction information, and for recognizing, as garbage noise reduction component, the noise reduction component whose rated value has been put in the range of the rated value indicated in said information; and a garbage noise reduction component deleting sub step for deleting noise reduction components recognized by said garbage noise reduction component recognizing sub step, and for modifying said circuit board information in accordance with the circuit from which the noise reduction components have been deleted as garbage noise reduction components.

* * * * *